(12) United States Patent
Basol et al.

(10) Patent No.: US 7,427,337 B2
(45) Date of Patent: Sep. 23, 2008

(54) SYSTEM FOR ELECTROPOLISHING AND ELECTROCHEMICAL MECHANICAL POLISHING

(75) Inventors: Bulent M. Basol, Manhattan Beach, CA (US); Jalal Ashjaee, Cupertino, CA (US); Boris Govzman, Sunnyvale, CA (US); Homayoun Talieh, San Jose, CA (US); Bernard M. Frey, Livermore, CA (US)

(73) Assignee: Novellus Systems, Inc., San Jose, CA (US)

( * ) Notice: Subject to any disclaimer, the term of this patent is extended or adjusted under 35 U.S.C. 154(b) by 657 days.

(21) Appl. No.: 10/822,424

(22) Filed: Apr. 12, 2004

(65) Prior Publication Data

US 2005/0133379 A1 Jun. 23, 2005

Related U.S. Application Data

(63) Continuation-in-part of application No. 10/391,924, filed on Mar. 18, 2003.

(51) Int. Cl.
*B23H 3/00* (2006.01)
*B23H 3/02* (2006.01)

(52) U.S. Cl. .................. 204/230.2; 204/193; 204/194; 204/242

(58) Field of Classification Search ............. 205/640, 205/686; 204/193, 194, 242, 230.2
See application file for complete search history.

(56) References Cited

U.S. PATENT DOCUMENTS

| | | |
|---|---|---|
| 3,328,273 A | 6/1967 | Creutz et al. |
| 3,595,089 A | 7/1971 | Watts |
| 3,779,887 A | 12/1973 | Gildone |
| 3,959,089 A | 5/1976 | Watts |
| 4,269,686 A | 5/1981 | Newman et al. |
| 4,339,319 A | 7/1982 | Aigo |
| 4,430,173 A | 2/1984 | Boudot et al. |
| 4,431,501 A | 2/1984 | Leppanen |
| 4,609,450 A | 9/1986 | Seimiya et al. |
| 4,610,772 A | 9/1986 | Palnik |

(Continued)

FOREIGN PATENT DOCUMENTS

DE 2008664 7/1971

(Continued)

OTHER PUBLICATIONS

Contolini et al., "Electrochemcial planarization for multilevel metallization," Sep. 1994, pp. 2503-2510.

(Continued)

*Primary Examiner*—Harry Wilkins
*Assistant Examiner*—Zulmariam Mendez
(74) *Attorney, Agent, or Firm*—Knobbe, Martens, Olson & Bear, LLP

(57) ABSTRACT

An apparatus for electropolishing a conductive layer on a wafer using a solution is disclosed. The apparatus comprises an electrode assembly immersed in the solution configured proximate to the conductive layer having a longitudinal dimension extending to at least a periphery of the wafer, the electrode assembly including an elongated contact electrode configured to receive a potential difference, an isolator adjacent the elongated contact electrode, and an elongated process electrode adjacent the isolator configured to receive the potential difference, a voltage supply is configured to supply the potential difference between the contact electrode and the process electrode to electropolish the conductive layer on the wafer.

22 Claims, 21 Drawing Sheets

U.S. PATENT DOCUMENTS

| | | | |
|---|---|---|---|
| 4,948,474 A | 8/1990 | Miljkovic | |
| 4,954,142 A | 9/1990 | Carr et al. | |
| 4,975,159 A | 12/1990 | Dahms | |
| 5,024,735 A | 6/1991 | Kadija | |
| 5,084,071 A | 1/1992 | Nenadic et al. | |
| 5,171,412 A | 12/1992 | Talieh et al. | |
| 5,256,565 A | 10/1993 | Bernhardt et al. | |
| 5,354,490 A | 10/1994 | Yu et al. | |
| 5,429,733 A | 7/1995 | Ishida | |
| 5,447,615 A | 9/1995 | Ishida | |
| 5,472,592 A | 12/1995 | Lowery | |
| 5,516,412 A | 5/1996 | Andricacos et al. | |
| 5,553,527 A | 9/1996 | Harrison | |
| 5,558,568 A | 9/1996 | Talieh et al. | |
| 5,660,708 A | 8/1997 | Tezuka et al. | |
| 5,681,215 A | 10/1997 | Sherwood et al. | |
| 5,692,947 A | 12/1997 | Talieh et al. | |
| 5,700,366 A | 12/1997 | Steblianko et al. | |
| 5,755,859 A | 5/1998 | Brusic et al. | |
| 5,762,544 A | 6/1998 | Zuniga et al. | |
| 5,770,095 A | 6/1998 | Sasaki et al. | |
| 5,773,364 A | 6/1998 | Farkas et al. | |
| 5,779,492 A | 7/1998 | Okuyama et al. | |
| 5,793,272 A | 8/1998 | Burghartz et al. | |
| 5,795,215 A | 8/1998 | Guthrie et al. | |
| 5,807,165 A | 9/1998 | Uzoh et al. | |
| 5,833,820 A | 11/1998 | Dubin | |
| 5,840,629 A | 11/1998 | Carpio | |
| 5,858,813 A | 1/1999 | Scherber et al. | |
| 5,863,412 A | 1/1999 | Ichinose et al. | |
| 5,871,626 A | 2/1999 | Crafts et al. | |
| 5,884,990 A | 3/1999 | Burghartz et al. | |
| 5,897,375 A | 4/1999 | Watts et al. | |
| 5,911,619 A | 6/1999 | Uzoh et al. | |
| 5,922,091 A | 7/1999 | Tsai et al. | |
| 5,930,669 A | 7/1999 | Uzoh | |
| 5,933,753 A | 8/1999 | Simon et al. | |
| 5,954,997 A | 9/1999 | Kaufman et al. | |
| 5,985,123 A | 11/1999 | Koon | |
| 6,004,880 A | 12/1999 | Liu et al. | |
| 6,027,631 A | 2/2000 | Broadbent | |
| 6,056,869 A | 5/2000 | Uzoh | |
| 6,063,506 A | 5/2000 | Andricacos et al. | |
| 6,066,030 A | 5/2000 | Uzoh | |
| 6,071,384 A * | 6/2000 | Schimion | 204/206 |
| 6,071,388 A | 6/2000 | Uzoh | |
| 6,074,544 A | 6/2000 | Reid et al. | |
| 6,103,085 A | 8/2000 | Woo et al. | |
| 6,132,586 A | 10/2000 | Adams et al. | |
| 6,132,587 A | 10/2000 | Jorne et al. | |
| 6,136,163 A | 10/2000 | Cheung et al. | |
| 6,143,155 A | 11/2000 | Adams et al. | |
| 6,176,992 B1 | 1/2001 | Talieh | |
| 6,197,182 B1 | 3/2001 | Kaufman et al. | |
| 6,210,554 B1 | 4/2001 | Kosaki et al. | |
| 6,251,235 B1 | 6/2001 | Talieh et al. | |
| 6,270,646 B1 | 8/2001 | Walton et al. | |
| 6,379,223 B1 | 4/2002 | Sun et al. | |
| 6,395,152 B1 * | 5/2002 | Wang | 204/224 M |
| 6,440,295 B1 | 8/2002 | Wang | |
| 6,471,847 B2 | 10/2002 | Talieh et al. | |
| 6,497,800 B1 | 12/2002 | Talieh et al. | |
| 6,537,144 B1 | 3/2003 | Tsai et al. | |
| 6,582,281 B2 | 6/2003 | Doan et al. | |
| 6,855,239 B1 | 2/2005 | Jairath | |
| 7,247,577 B2 * | 7/2007 | Palmgren et al. | 438/746 |
| 2001/0007306 A1 * | 7/2001 | Ichinose et al. | 205/666 |
| 2001/0035354 A1 | 11/2001 | Ashjaee et al. | |
| 2002/0074238 A1 | 6/2002 | Mayer et al. | |
| 2002/0102853 A1 | 8/2002 | Li | |
| 2003/0223764 A1 | 12/2003 | Moore et al. | |
| 2004/0178060 A1 | 9/2004 | Ravkin et al. | |

FOREIGN PATENT DOCUMENTS

| | | |
|---|---|---|
| DE | 2008664 | 9/1971 |
| DE | 4324330 | 3/1994 |
| FR | 2763343 | 5/1998 |
| FR | 2763343 | 11/1998 |
| GB | 1350070 | 4/1974 |
| JP | 6-108285 | 4/1994 |
| JP | 11-054479 | 2/1999 |
| WO | WO 97/01657 | 1/1997 |
| WO | WO 98/27585 | 6/1998 |
| WO | WO 99/64647 | 12/1999 |
| WO | WO 00/03426 | 1/2000 |
| WO | WO 00/26443 | 5/2000 |
| WO | WO 02/064314 | 8/2002 |

OTHER PUBLICATIONS

Kelly et al, "Leveling and microstructural effects of additives for copper electrodeposition," *Journal of Electrochemical Society*, 1999, pp. 2540-2545, vol. 146, No. 7.

Madore et al., "Blocking inhibitors in Catholic leveling," *Theoretical Analysis*, Dec. 1997, pp. 3927-3942.

Mikkola et al., "Investigation of the roles of the additive components for second generation copper electroplating chemistries used for advanced interconnect metallization," *2000 IEEE*, Jun. 2000, pp. 117-119, IEEE Electron Devices Society.

Rubinstein, "Tampongalvanisieren in der Praxis, Teil 1," *Galvanotechnik*, Sep. 2000, vol. 79, No. 10, pp. 3263-3270.

Steigerwald et al., "Pattern geometry effects in the chemical-mechanical polishing of inlaid copper structures," Oct. 1994, pp. 2842-2848.

West et al., "Pulse reverse copper electrodeposition in high aspect ratio trenches and vias," Sep. 1998, pp. 3070-3073.

Contolini et al., "Electrochemical Planarization for Multilevel Metallization," J. Electrochem. Soc., 1994, vol. 141, pp. 2503-2510.

Kelly et al, "Leveling and Microstructural Effects of Additives for Copper Electrodeposition," J. Electrochem. Soc., 1999, vol. 146, No. 7, pp. 2540-2545.

Madore et al., "Blocking inhibitors in Catholic Leveling,"*Theoretical Analysis*, Dec. 1997, pp. 3927-3942.

Mikkola et al., "Investigation of the Roles of the Additive Components for Second Generation Copper Electroplating Chemistries Used for Advanced Interconnect Metallization," *2000 IEEE*, Jun. 2000, pp. 117-119, IEEE Electron Devices Society.

Rubinstein, "Tampongalvanisieren in der Praxis, Teil 1," *Galvanotechnik*, 1988, vol. 79, No. 10, pp. 3263-3270.

Joseph M. Steigerwald et al., "Chemical Mechanical Planarization of Microelectronic Materials," A Wiley-Interscience Publication, 1997 by John Wiley & Sons, Inc. pp. 212-222.

Steigerwald et al., "Pattern Geometry Effects in the Chemical-Mechanical Polishing of Inlaid Copper Structures," J. Electrochem. Soc., 1994, vol. 141, pp. 2842-2848.

West et al., "Pulse Reverse Copper Electrodeposition in High Aspect Ratio Trenches and Vias," J. Electrochem. Soc., 1998, vol. 145, pp. 3070-3073.

* cited by examiner

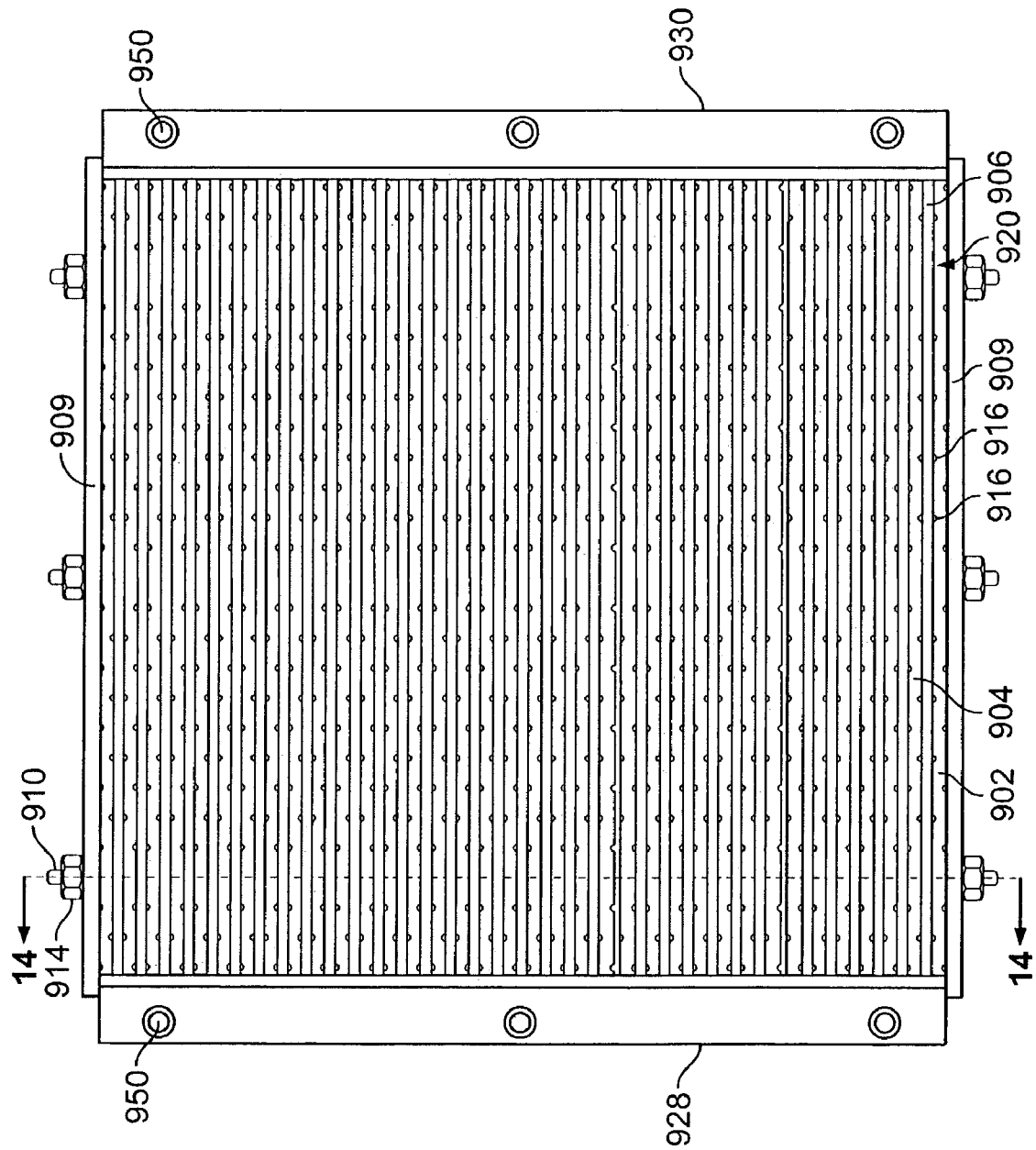

SYSTEM FOR ELECTROPOLISHING AND ELECTROCHEMICAL MECHANICAL POLISHING

RELATED APPLICATIONS

This application is a continuation-in-part of U.S. application Ser. No. 10/391,924, filed Mar. 18, 2003, incorporated herein by reference.

FIELD

The present invention generally relates to semiconductor integrated circuit technology and, more particularly, to an electroetching or electropolishing process and apparatus.

BACKGROUND

Conventional semiconductor devices generally include a semiconductor substrate, usually a silicon substrate, and a plurality of sequentially formed dielectric layers such as silicon dioxide and conductive paths or interconnects made of conductive materials. Interconnects are usually formed by filling a conductive material in trenches etched into the dielectric layers. In an integrated circuit multiple levels of interconnect networks laterally extend with respect to the substrate surface. Interconnects formed in different layers can be electrically connected using vias or contacts.

The filling of a conductive material into features such as vias, trenches, pads or contacts, can be carried out by electrodeposition. In electrodeposition or electroplating method, a conductive material, such as copper is deposited over the substrate surface including into such features. Then, a material removal technique is employed to planarize and remove the excess metal from the top surface, leaving conductors only in the features or cavities. The standard material removal technique that is most commonly used for this purpose is chemical mechanical polishing (CMP). Chemical etching and electropolishing, which is also referred to as electroetching or electrochemical etching, are also attractive process options that are being evaluated for this application. Copper is the material of choice, at this time, for interconnect applications because of its low resistivity and good electromigration properties. Therefore, the present invention will be described for the electropolishing of copper and copper alloy layers as an example, although electropolishing of other materials such as Pt, Co, Ni etc., can also be achieved using the method and apparatus of this invention.

Standard electroplating techniques yield copper layers that deposit conformally over large features, such as features with widths larger than a few micrometers. This results in a plated wafer surface topography that is not flat. FIG. 1A shows a workpiece surface 100 with an exemplary via 102 and an exemplary trench 104 coated with conductor 106 using standard electroplating technique. As can be seen from this figure, although the surface of the conductor 106 may be flat over the small via 102, the surface of the conductor 106 over the larger trench 104 has a step "S". During the excess conductor or overburden removal process step employing CMP, etching or electroetching, this non-flat surface topography needs to be planarized as the excess conductor is removed from the surface leaving it only within the features. If planarization is not achieved, as the thickness of the conductor is reduced, presence of the step S causes loss of conductor from within the large trench. Dashed lines 110 and 112 schematically show how conductor loss from the trench may increase from an amount "d" to a larger amount "D" as the excess conductor thickness on the surface is reduced from "t" to nearly zero, respectively. As can be appreciated, such conductor loss from within features is not acceptable.

CMP techniques have been developed to provide the capability of planarizing and at the same time removing the excess conductor layers. This is shown in FIG. 1B as dashed lines of 120 and 122. After excess conductor removal, the resulting surface is ideally planar as indicated by dashed line 122, and both the via 102 and the trench 104 are completely filled with the conductor. It should be noted that any remaining part of the excess conductor along with any other conductor layer (such as a barrier layer) are all removed to assure electrical isolation between the conductors within features 102 and 104.

Planarization capability of standard electroetching techniques is not as good as CMP. Therefore, results from these processes may lie somewhere between the cases shown in FIGS. 1A and 1B. Planarization capability of electroetching may be increased and the ideal result shown as dashed line 122 in FIG. 1B may be approached by employing a planarization pad or workpiece surface influencing device (WSID) which introduces mechanical action on the wafer surface as the conductor removal from the workpiece surface is performed. This way it may be possible to planarize the non-planar or non-flat copper surface as the excess copper is removed. Since there is mechanical action in such processes they are referred to as Electrochemical Mechanical Etching (ECME) or Electrochemical Mechanical Polishing. As the name suggest, in such approaches, electroetching is carried out as the wafer surface is contacted by a planarization pad and relative motion is established between the wafer surface and the planarization pad.

As described above, standard electroplating techniques yield conformal deposits and non-planar workpiece surfaces that need to be planarized during the excess material removal step. Newly developed electrodeposition techniques, which are collectively called Electrochemical Mechanical Deposition (ECMD) methods, utilize a pad or WSID in close proximity of the wafer surface during conductor deposition. Action of the WSID during plating gives planar deposits with flat surface topography even over the largest features present on the workpiece surface. Such a planar deposit is shown as layer 130 in FIG. 1C. Removal of excess conductive material, such as copper from such planar deposits does not require further planarization during the material removal step. Therefore, CMP, electroetching, chemical etching, electrochemical mechanical etching and chemical mechanical etching techniques may all be successfully employed for removing the overburden in a planar and uniform manner in this case.

There are several patents and patent applications describing the electroetching process carried out with the assistance of the mechanical action provided by a pad or WSID. Details of such processes are given in the following patents and patent applications: U.S. Pat. No. 6,402,925; U.S. application Ser. No. 10/238,665, entitled "Method and Apparatus for Electro-Chemical Mechanical Deposition," filed Sep. 9, 2002 now U.S. Pat. No. 6,902,659; U.S. application Ser. No. 09/671,800, entitled "Process to Minimize and/or Eliminate Conductive Material Coating over the Top Surface of a Patterned Substrate and Layer Structure Made Thereby," filed Sep. 28, 2000; U.S. application Ser. No. 09/841,622, entitled "Electroetching Process and System," filed Apr. 23, 2001, now U.S. Pat. No. 6,852,630; U.S. application Ser. No. 10/201,604, entitled "Multi Step Electrodeposition Process for Reducing Defects and Minimizing Film Thickness," filed Jul. 22, 2002, now U.S. Pat. No. 6,946,066; and U.S. Provisional Application Ser. No. 60/362,513, filed Sep. 1, 2003, entitled "Method and Apparatus for Planar Material Removal Technique Using Multi-Phase Process Environment," filed Mar. 6, 2002.

During the standard electrodeposition and electroetching processes, workpiece or wafer is typically contacted on its front surface near its edge, all around its circumference. The conventional way of contacting the wafer involves a clamp-ring design where electrical contacts such as spring-loaded metallic fingers are pressed against the edge of the surface along the perimeter of the wafer. Contacts are protected from the process solution using seals such as O-rings or lip seals that are pushed against the wafer surface at the edge. Advance of low-k material usage in wafer processing, however, is bringing new restrictions to the use of such contacts. Low-k materials are relatively soft and mechanically weak. Pressing metallic contacts and seals against conductive films deposited on low-k materials causes damage to such materials and may even cause loss of electrical contact since the conductive film over the damaged low-k layer may itself become discontinuous. To address this challenge, a new method for forming an electrical contact to a wafer edge has been disclosed in U.S. Pat. Nos. 6,471,847 and 6,251,235, which are commonly owned by the assignee of the present invention. In this approach there is no metallic contact touching the wafer. Electrical contact is achieved using a liquid conductor, which is confined within a chamber.

Review of the above mentioned art related to Electrochemical Mechanical Etching and Electrochemical Mechanical Deposition techniques will reveal that these methods have the capability to electrotreat, i.e., electrodeposit as well as electropolish, full surface of the wafer without any need to set aside a "contacting region" protected from the process solution, such as the edge surface region that would be under a clamp-ring in an apparatus that uses electrical contacts with a clamp-ring design.

Contact designs that allow full-face electrodeposition or electroetching have been described in the following U.S. patent applications: U.S. application Ser. No. 09/685,934, entitled "Device Providing Electrical Contact to the Surface of a Semiconductor Workpiece During Metal Plating," filed Oct. 11, 2000, now U.S. Pat. No. 6,497,800; U.S. application Ser. No. 09/735,546, entitled "Method of and Apparatus for Making Electrical Contact to Wafer Surface for Full-Face Electroplating or Electropolishing," filed Dec. 14, 2000, now U.S. Pat. No. 6,482,307; and U.S. application Ser. No. 09/760,757, entitled "Method and Apparatus for Electrodeposition of Uniform Film with Minimal Edge Exclusion on Substrate," filed Jan. 17, 2001, now U.S. Pat. No. 6,610,190, all commonly owned by the assignee of the present invention. As described in these applications, one method of making electrical contact to the workpiece surface involves physically touching the conductive surface of the workpiece by conductive contact elements, such as wires, fingers, springs, rollers, brushes etc., and establishing a relative motion between the contact elements and the wafer surface so that different sections of the wafer surface is physically and electrically contacted at different times. In another method, electrical contact to the workpiece surface is achieved without physically touching the wafer by the conductive contact elements. Either way, electrical contacts may be made substantially all over the surface of the wafer or only at the edge region of the wafer.

Although much progress has been made in electropolishing approaches and apparatus including contacting means of the workpiece during electropolishing, there is still need for alternative contacting means and electroetching techniques that uniformly remove excess conductive films from workpiece surfaces without causing damage and defects especially on advanced wafers with low-k materials.

SUMMARY OF THE INVENTION

The present invention overcomes the identified limitations of conventional electropolishing approaches and provides alternative contacting means and electroetching techniques that uniformly remove conductive films from a workpiece surface.

In one or more embodiments of the invention, an apparatus and a method for electropolishing a surface of a conductive layer on a workpiece are disclosed. The method of the present invention includes the steps immersing a contact electrode in a contact solution, contacting a portion of the surface of the conductive layer with the contact solution to define a contact region, immersing a process electrode in a process solution, contacting a portion of the surface of the conductive layer with the process solution to define a process region, and applying an electrical potential between the contact electrode and the process electrode to electropolish the surface of the conductive layer of the process region.

According to another aspect of the invention, the method further includes the step of moving at least one of the contact or process region from a first location to a second location on the surface of the conductive layer. In moving at least one of the regions from the first location to another location throughout the process, the entire surface of the conductive layer can be electropolished.

In another aspect of the invention, the contact solution and the process solution are the same conductive solution. The conductive solution contacts the surface of the conductive layer.

According to another aspect of the invention, a second contact electrode is provided, and the method further includes the steps of immersing the second electrode in the contact solution, contacting a portion of the surface of the conductive layer with the contact solution to define a second contact region, and applying an electrical potential between the contact electrodes and the process electrode to electropolish the second contact region.

According to another aspect of the invention, the method further includes the step of contacting the surface of the conductive layer with a top surface of a pad thereby planarizing non-uniformities of the surface of the conductive layer during electropolishing. The top surface of the pad may be abrasive. The pad may intermittently contact the surface of the conductive layer.

In another embodiment of the present invention, an apparatus for electropolishing a surface of a conductive layer on a workpiece includes a contact unit containing a contact solution, a contact electrode immersed therein and having an opening through which the contact solution contacts a portion of the surface of the conductive layer to define a contact region, and a process unit containing a process solution, a process electrode immersed therein and having an opening through which the process solution contacts a portion of the surface of the conductive layer to define a process region configured to electropolish the surface of the conductive layer defined by the process region in response to a potential difference applied between the contact electrode and the process electrode.

According to other aspects of the invention, the contact electrode and/or the process electrode may be proximate to the surface of the conductive layer. The potential difference includes a DC voltage or a variable voltage.

According to yet another aspect of the invention, a mechanism produces relative motion between the process region and the surface of the conductive layer to electropolish substantially the whole surface of the conductive layer on the workpiece. The mechanism may further produce relative motion between the contact region and the surface of the conductive layer.

According to additional aspects of the invention, the process unit includes a plurality of process openings through which the process solution contacts portions of the surface of the conductive layer to define a plurality of process regions and the potential difference applied between the contact electrode and the process electrode electropolishes the surface of the conductive layer defined by the plurality of process regions. Moreover, the contact unit includes a plurality of contact openings through which the contact solution contacts portions of the surface of the conductive layer, each contact opening includes a contact electrode disposed therein and the potential difference applied between the contact electrodes and the process electrode electropolishes the surface of the conductive layer defined by the plurality of process regions.

In yet other aspects of the invention, a first set of contact units is configured to contact portions of the surface of the conductive layer wherein the potential difference applied between the contact electrodes of the first set of contact units and the process electrode electropolishes the surface of the conductive layer defined by a first set of process regions. Moreover, a second set of contact units is configured to contact portions of the surface of the conductive layer wherein a second potential difference applied between the contact electrodes of the second set of contact units and the process electrode electropolishes the surface of the conductive layer defined by a second set of process regions.

In yet another aspect of the invention, a zone switch is configured to select the first contact zone or the second contact zone to apply the potential difference. The potential difference and the second potential difference may be different voltages.

The above and additional advantages of the present invention will become apparent to those skilled in the art from a reading of the following detailed description when taken in conjunction with the accompanying drawings.

SUMMARY OF THE INVENTION

The present invention overcomes the identified limitations of conventional electropolishing approaches and provides alternative contacting means and electroetching techniques that uniformly remove conductive films from a workpiece surface. The present invention achieves electropolishing of the conductive films through the combination of the use of a process solution and electrical contact electrodes that do not make physical contact to the workpiece surface.

BRIEF DESCRIPTION OF THE DRAWINGS

FIGS. 3E-3G 3D are schematic illustrations of various designs of the contact units and process units for establishing electrical contact with and processing a wafer surface;

FIG. 14B is a schematic plan view of the array of an holder structure shown in FIG. 14B:

DETAILED DESCRIPTION

As will be described below, the present invention provides a method and a system to electroetch or electropolish a conductive material layer deposited on a surface of a semiconductor. The invention can be used with Electrochemical Mechanical Etching processes or conventional electroetching systems. The present invention achieves electroetching of the conductive material through the combination of the use of a process solution and electrical contact elements that do not make physical contact to the workpiece surface.

Figure 2A:
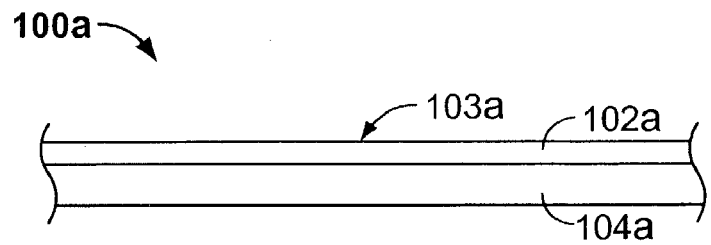
FIG. 2A is a schematic cross-sectional view of a portion of a semiconductor wafer having a copper layer formed on it.
Figure 2B:
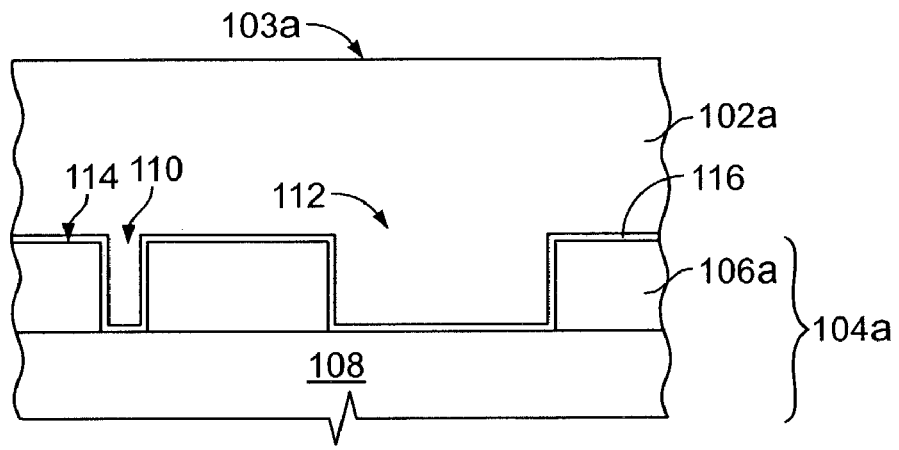
FIG. 2B is a schematic cross sectional view of the semiconductor wafer in detail.

Reference will now be made to the drawings wherein like numerals refer to like parts throughout. FIG. 2A shows a cross-sectional view of a portion of a workpiece 100a. The workpiece may be an exemplary portion of a preprocessed semiconductor wafer. As also shown in FIG. 2B in detail, a top layer 102a of the workpiece 100a may include a layer of conductive material such as electroplated copper. A bottom layer 104a of the workpiece may include an insulating layer 106a such as a low-k dielectric film and substrate 108 of the wafer, preferably silicon. In this embodiment, although the conductive layer 102a is a part of the workpiece 100a, it is within the scope of the present invention that the workpiece 100a may be entirely made of a conductive material.

The insulating layer is patterned to provide a via feature 110 and a trench feature 112. The features and surface 114 of the insulating layer may be lined with a barrier layer 116 such as a layer of Ta, TaN, Ti, WCN, WN, TiN or a composite of these materials. The barrier layer may be also coated with a conductive seed layer such as a copper seed layer that is not shown in FIG. 2B for the purpose of clarity. Such seed layers are commonly deposited on semiconductor wafers before conductive layer deposition. The workpiece 100a may comprise a plurality of via, trench and other features. As illustrated in FIG. 2B, in order to exemplify one embodiment of the present invention the surface 103a of the conductive layer 102a may be planar, i.e. may not have a surface topography having high and low regions formed during the deposition of the conductive layer 102a. It should be appreciated that the invention can also process non-planar wafer surfaces.

Figure 3A:
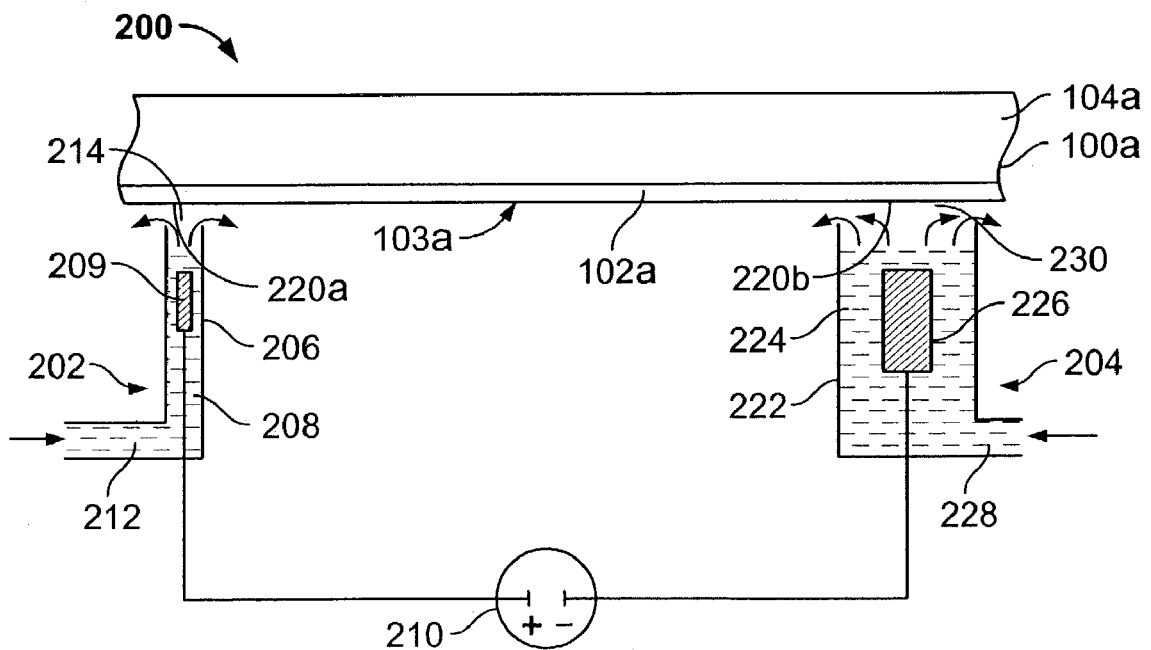
FIG. 3A is a schematic illustration of an embodiment of an electropolishing system of the present invention.

FIG. 3A schematically explains how electropolishing of a material on a wafer surface may be achieved using a remote electrical contact to the wafer. The cross-sectional segment in FIG. 3A shows a portion of an exemplary electroetching or electropolishing system 200 to electrochemically etch a portion of the copper layer 102a, off the surface of the workpiece 100a, which is held by a wafer carrier (not shown). The electroetching system in this example embodiment has a contact unit 202 and a process unit 204. As will be described more fully below, the contact unit 202 is able to establish electrical contact with the conductive layer 102a through a liquid contact solution.

In this respect, the contact unit 202 comprises a contact container 206 or a contact nozzle to contain a contact solution 208. A contact electrode 209 is placed inside the contact container 206 and thus immersed in the contact solution 208. The contact electrode does not physically touch the surface 103a of the copper layer 102a. The contact electrode 209 is electrically connected to a positive terminal of a power source 210. Contact solution 208 fills the container through a contact inlet 212 and leaves the container through contact opening 214. The inlet 212 may be connected to a contact solution reservoir (not shown). The contact opening 214 is placed in close proximity of a contact region 220a of the surface 103a of the conductive layer 102a. As the contact solution 208 flows through the opening 214, it physically touches the contact area and establishes electrical communication between the electrode 209 and the contact region 220a since it is a conductive liquid. For lowest voltage drop, the contact electrode 209 is as close as possible to the contact area 220a. However, if the resistivity of the contact solution 208 is low and the voltage drop is not a concern the contact electrode 209 may even be placed outside the contact container and placed anywhere as long as it maintains physical contact with the contact solution 208.

The process unit 204 comprises a process container 222 or a process nozzle to contain process solution 224, which is an electroetching or electropolishing solution. A process electrode 226 is located inside the process container 222 and kept immersed in the process solution 224. It should be noted that the process electrode does not have to be confined in the process container. It may be outside as long as it physically touches the process solution and therefore establishes electrical contact with it. The process electrode 226 is electrically connected to a negative terminal of the power source 210. Process solution 224 fills the process container through a process inlet 228 and exits the container through process opening 230. The process solution 224 can be re-circulated or agitated. The inlet 228 may be connected to a process solution reservoir (not shown). The process opening 230 is placed in close proximity of a process region 220b of the surface 103a of the conductive layer 102a. In this embodiment, the process region 220b may be approximately equal to the area of the process opening 230. The process solution 224 flowing through the opening 230 contacts the process region 220b and establishes electrical contact between the process electrode 226 and the process region 220b. Although a specific contact region and process region are illustrated in FIG. 3A, it is understood that these regions may be located anywhere on the workpiece. Furthermore, a plurality of contact units and process units may be used. The contact solution and the process solution may be different solutions or they may be same. If they are the same solution, they need to be effective electroetching or electropolishing solutions for the material to be removed from the workpiece surface.

Figure 3B:
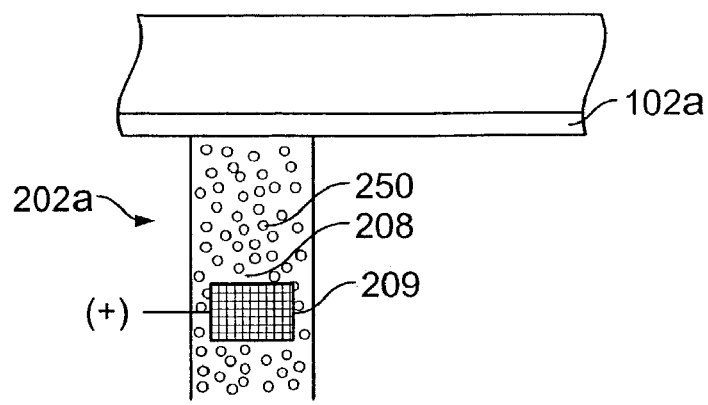
FIGS. 3B-3D are schematic illustrations of various embodiments of the contact units for establishing electrical contact with wafer surface through the process solution.

The contact units and process units may be constructed in different ways using various different materials. For example, it is possible that the contact electrode 209 is on the wall of the container 206 or it actually is the wall of the container 206. Similar approach may be used for the construction of the process container 222. The contact or process units may comprise an insulating spongy material within which the conductive electrodes are embedded. FIG. 3B shows such a case for the contact unit 202a, comprising insulating spongy material 250, which holds and passes through the contact solution 208. Contact electrode 209 touches the contact solution 208 in the sponge 250. It should be noted that, as shown in FIG. 3B, the spongy material may physically touch the copper film 102a surface during electropolishing since it is a soft material and does not damage the surface. Similarly, use of an insulating spongy material or insulating soft pad in the construction of the process unit, which may physically contact the wafer surface during processing is within the scope of this invention.

Figure 3C:
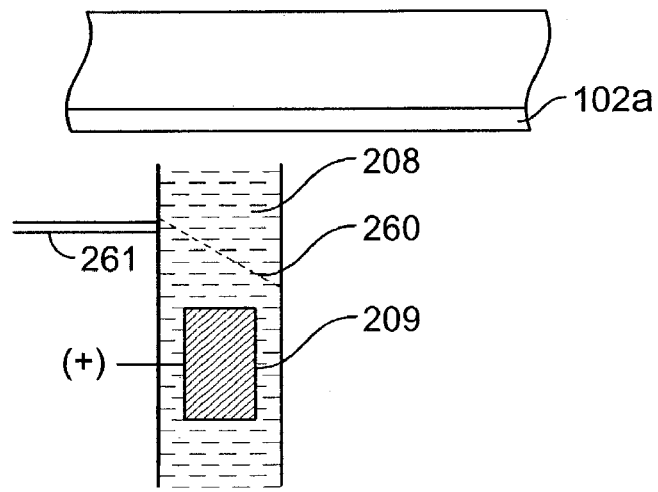
Figure 3D:
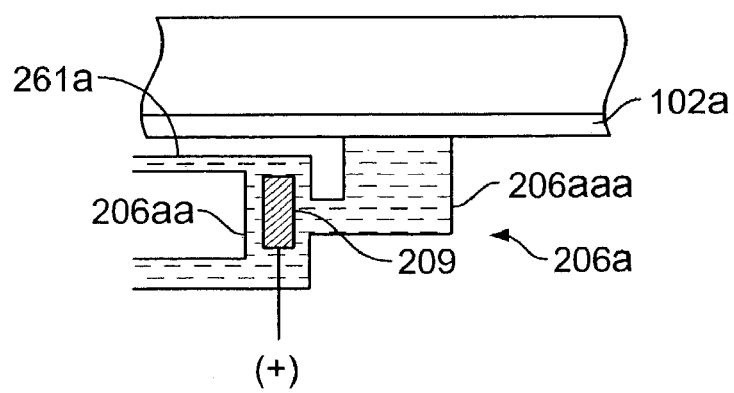

Referring to FIG. 3A, electroetching of the copper layer 102a is initiated at the process region 220b when a potential is applied between the contact electrode 209, which is anode, and the process electrode 226, which is cathode. The electrical current passes from the contact electrode 209 to the contact solution 208 and through the contact solution enters the copper layer 102a at the contact region 220a. The current then flows in the copper layer 102a towards the process region 220b, enters the electroetching solution 224 and flows to the process electrode 226. In this respect, the contact electrode 209 is more anodic than the copper film at the contact region 220a and the copper film at the process region 220b is more anodic than the cathode 226. The anodic voltage on the copper film at the process region causes electropolishing or electroetching of the copper in this particular region. The copper removed from the substrate in this region deposits on the process electrode 226. If the solution is formulated to contain complexing agents it is possible that copper complexes to stay in the solution rather than deposit on the process electrode 226. However, in this embodiment the process solution is a standard electroetching solution such as a phosphoric acid solution. The contact electrode 209 is made of an inert material such as Pt or Pt-coated metal, stainless steel, conductive mesh or foam etc., and therefore anodic voltage on this inert electrode cannot remove any material. It may, however, generate bubbles of gas, which can be removed by the flowing solution or by other designs built in the contact unit. One such design is shown in FIG. 3C and it includes a permeable barrier 260 placed over the contact electrode 209. The permeable barrier 260 is porous and it lets the contact solution 208 through. It, however, does not allow the bubbles to go to the substrate surface by guiding them towards a bleed opening 261, which directs them away from the workpiece surface. Similar structure may be used in the process unit also. Another design shown in FIG. 3D is a two-chamber contact container 206*a*, which comprises a primary container 206*aa* and a secondary container 206*aaa*. The contact electrode 209 is placed in the primary container 206*aa*, and therefore any bubble that is generated may be diverted away from the substrate surface through the bleed opening 261*a*. More complex designs of contact containers and process containers utilizing multi chambers can be used for bubble minimization or elimination.

Referring back to FIG. 3A, since the copper film at the contact region 220*a* is more cathodic compared to the contact electrode 209, no copper dissolution is expected in this region. In fact, copper is protected by this cathodic voltage. In this respect, it is important that the contact solution does not contain any ions of materials that can deposit onto the surface of the copper layer and the contact electrode 209 does not contain any material that may be etched or electroetched by the contact solution 208. Therefore, deposition solutions containing ionic species of metals are not suitable for use as a contact solution.

During the process, the process unit is preferably moved between the edge of the workpiece and the center of the workpiece while the workpiece is rotated or otherwise moved. The movement of the process unit along the radius of the wafer can cause electoetching of the entire surface of the wafer as the wafer is rotated. Other motions can also be used. What is important is to make every point on the wafer a process region at some point in time to remove copper from substantially the whole surface. Scanning of the wafer surface by the process unit can be accomplished by moving the wafer, the process unit or both with respect to each other.

Figure 3E:
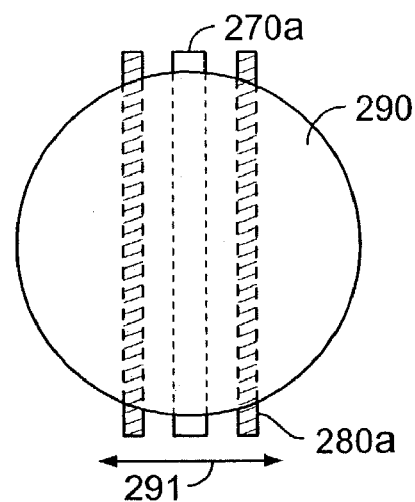
Figure 3F:
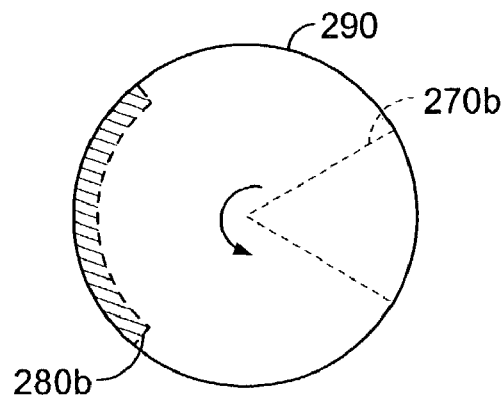
Figure 3G:
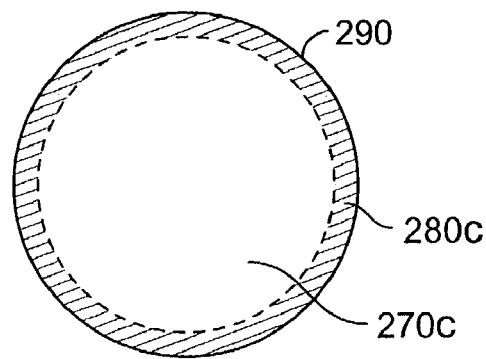

It is possible to design contact units and process units in different shapes and forms. These designs include but are not limited to circular, oval, pie shape, linear and others and they define the shape of the contact region and the process region. Depending upon the nature of the relative motion established between the workpiece surface and the contact and process units the most appropriate shapes of these units may be selected for the most uniform electroetching. Three of such examples are shown in FIGS. 3E, 3F, and 3G, which show the top view of process units 270*a*, 270*b* and 270*c*, and contact units 280*a*, 280*b* and 280*c*. Wafer 290 is placed in close proximity (preferably 0.1 to 5 mm range depending on the conductivity of the solutions used) of the process and contact units so that its copper coated surface (not shown) is wetted by the process and contact solutions. As explained before, when the electroetching process is initiated wafer 290 in FIG. 3E may be translated over the contact units 280*a*, and the process unit 270*a* in a linear direction 291. Wafer may also be slowly rotated. The linear motion may or may not be bi-directional. During process, the process unit 270*a* effectively scans the whole surface of the wafer for uniform material removal. Multiple contact units assure electrical contact to wafer at all times. Even more process and contact units may be used in the design (see for example, FIGS. 6A, 6B, 7A, 7B, 8A, 8B, 9A, 9B). A specific design of contact unit 280*b* and process unit 270*b*, appropriate for rotational motion of the wafer 290 is shown in FIG. 3F. The pie-shaped process region in this case scans the wafer surface for uniform material removal from the whole front surface. Contact unit 280*b* maybe placed anywhere at the edge of the wafer. Again, multiple contact and process units may be utilized in this design. In FIG. 3G, a ring-shaped contact region is provided. The process region, where material removal is carried out constitutes the rest of the wafer surface. In this case copper left in the contact region needs to be removed later using another process such as chemical etching or electrochemical etching. There are many other shapes and forms of the process and contact units that can be optimized for best uniformity of material removal.

Figure 4A:
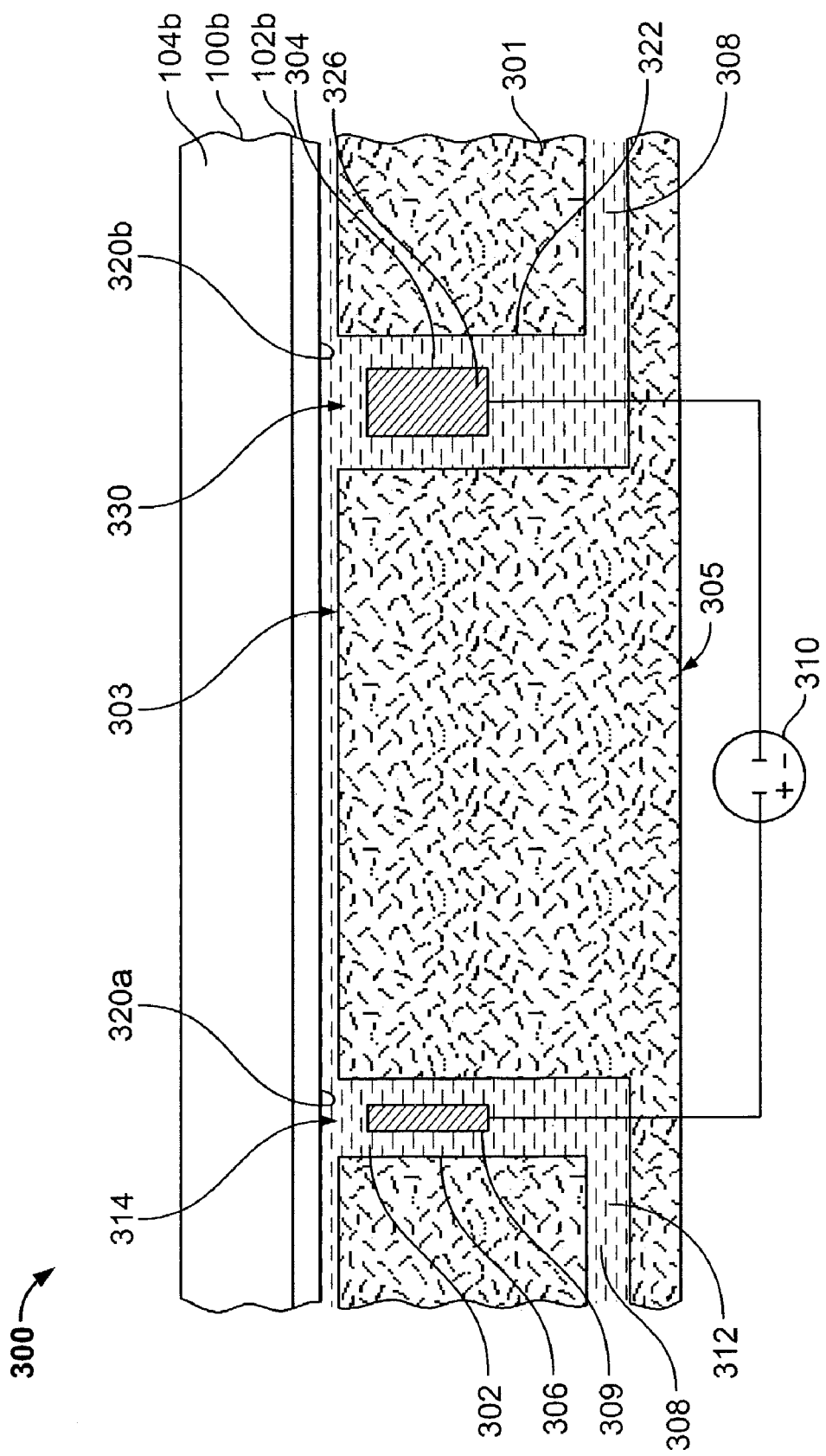
FIG. 4A is a schematic illustration of another embodiment of an electropolishing system of the present invention including multiple contact and process electrodes.
Figure 4B:
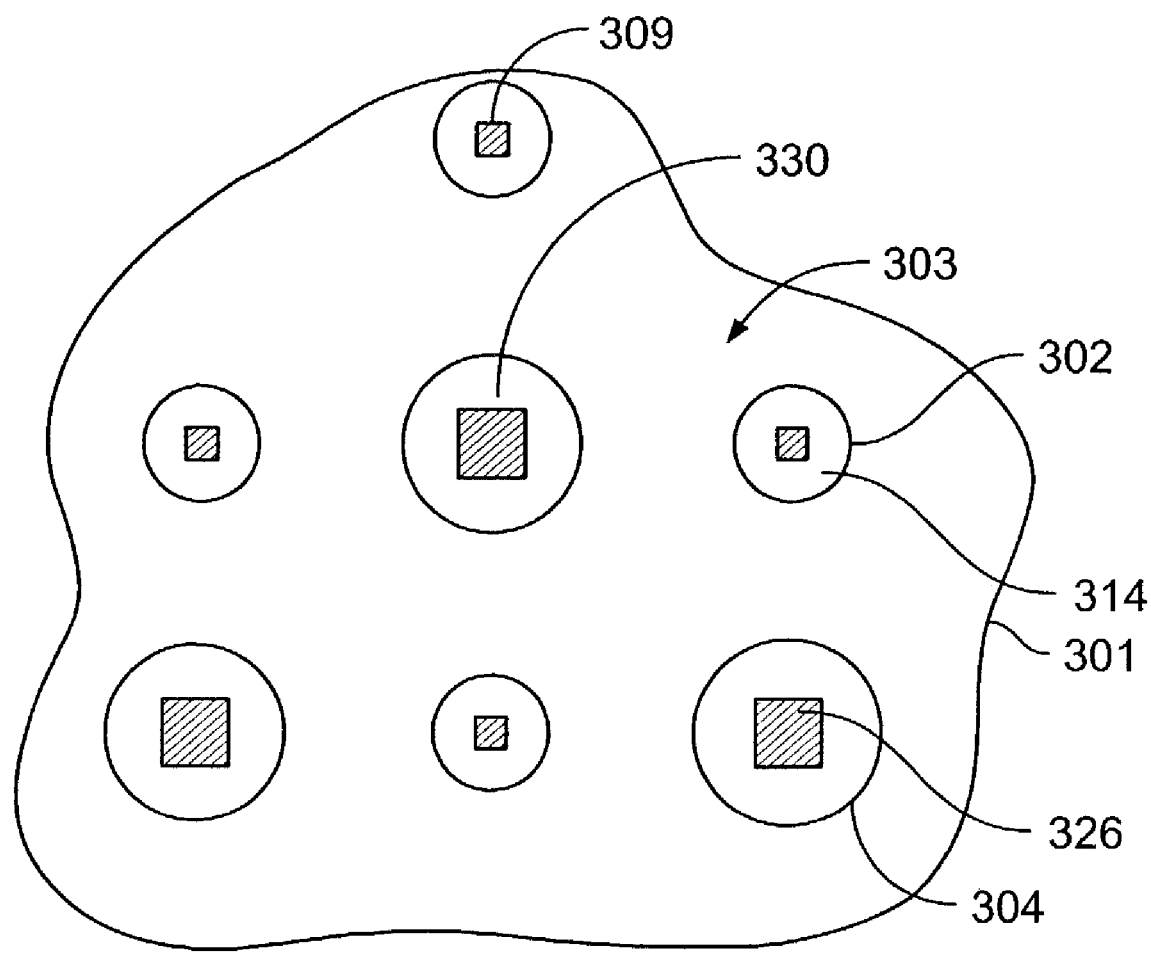
FIG. 4B is a schematic planar view of the electropolishing system shown in FIG. 4A.
Figure 5:
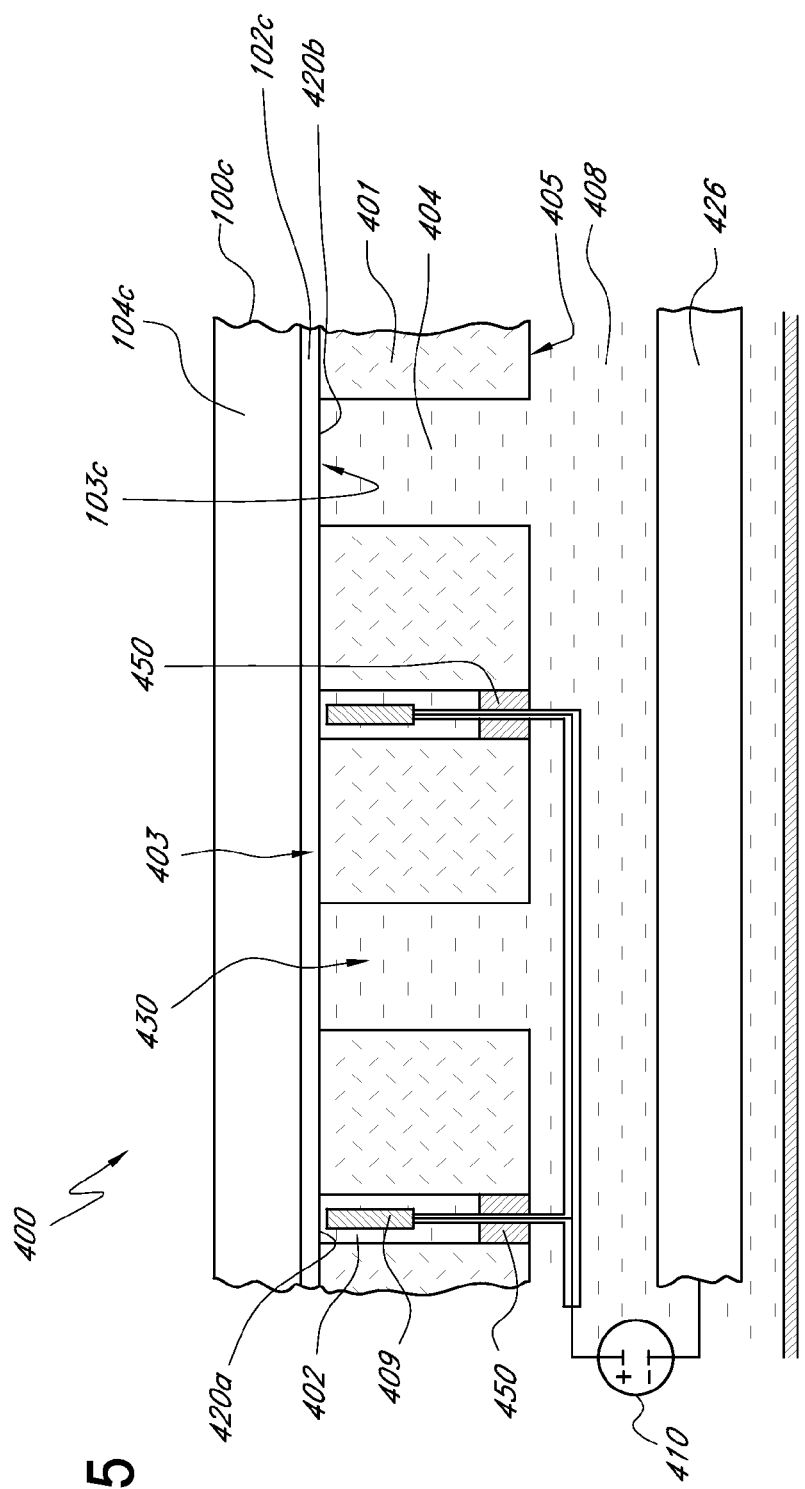
FIG. 5 is a schematic illustration of yet another embodiment of an electropolishing system of the present invention using multiple contact electrodes with a single process electrode.

FIGS. 4A, 4B and 5 illustrate two alternative electroetching systems that may include a plurality of contact units and process units. The contact and process units in these embodiments are held by various base structures that allow units to use the same electroetching solution as the contact solution as well as the process solution. In both embodiments, electrical contact to the wafer surface is established through the electroetching solution applied through the contact units. The contact electrodes do not physically contact to the surface of the wafer, however, as described earlier a soft, sponge or pad like material may be placed in the contact or process units and this material may touch the workpiece surface at the contact region and the process region. The electroetching solution provides the conductive path between the contact electrode and the conductive surface of the wafer.

Exemplary electroetching or electropolishing system 300 of FIG. 4A may be used for processing copper layer 102*b* of the substrate 100*b*, which is held by a carrier (not shown). The electroetching system in this example embodiment has also a contact unit 302 and a process unit 304. Differing from the previous embodiment, the units 302, 304 are held by or formed in a holder structure 301. The holder structure 301 in this embodiment is shaped as a plate having a top surface 303 and a bottom surface 305. As described in the previous embodiment, the contact unit 302 is able to establish electrical contact with the conductive layer 102*b* through a liquid electrical contact. During the process, the holder structure 301 and the workpiece may be moved relative to one another. The contact unit 302 or a contact nozzle may be comprised of a contact hole 306 formed in the holder structure 301. A contact electrode 309 inside the contact unit 306 is immersed in an electroetching solution 308. It should be understood that the contact electrode shown in FIG. 4A may totally fill the contact hole 306 in which case the electroetching solution 308 would mainly wet the top surface of the contact electrode 309. The top surface of the contact electrode may be below the level of the top surface 303 of the holder structure 301 as shown in FIG. 4A, it may be at the same level as the top surface 303 of the holder structure 301, it may even be above the top surface 303 of the holder structure 301 as long as it does not touch the surface of the wafer. These embodiments are applicable to all examples herein and any variations thereof.

In this embodiment, the electroetching solution 308 is used for both establishing contact and electroetching the conductive layer 102*b*. The contact electrode 309 is electrically connected to a positive terminal of a power source 310. The electroetching solution 308 fills the unit and touches the conductive layer. The contact opening 314 is preferably in the plane of the top surface 303 of the holder structure 301. The inlet 312 may be connected to a common electroetching solution reservoir (not shown) or the whole structure may be immersed into an electroetching solution that fills all the gaps including the contact unit and the process unit. The contact opening 314 is placed in close proximity of a contact region 320a of the surface 103b of the conductive layer 102b. Since the holder structure 301 and the wafer 100b is moved relative to one another during the process, the contact region 320a may be at any appropriate location on the surface of the wafer and may be at any location at a given instant. As the solution 308 wets the contact region, the solution establishes electrical contact between the electrode 309 and the contact region 320a since the solution 308 is selected to be conductive.

The process unit 304 may be comprised of a process hole 322. A process electrode 326 is in physical contact with the solution 308. The process electrode 326 is electrically connectable to a negative terminal of the power source 310. The top surface 303 of the holder structure is placed across the surface of the wafer in a substantially parallel fashion during the process. In this respect, the process opening 330 is placed in close proximity of a process region 320b of the surface 103b of the conductive layer 102b. In this embodiment, the process region may be approximately equal to the area of the opening 230. Due to the relative motion between the wafer and the holder structure 301, the process region 320b may be at various locations on the surface 103b of the wafer at different times during the process.

FIG. 4B shows the top surface 303 of an exemplary holder structure 301 in plan view. The top surface 303 comprises contact and process openings 314, 330 of the units 302 and 304, which may be distributed in a predetermined pattern. Shapes of the process openings and contact openings shown in FIG. 4B are only exemplary, and as discussed in relation to FIGS. 3A, 3B, 3C, 3D, 3E, 3F, 3G, various shapes and forms of process or contact units may be employed. The contact electrodes 309 and process electrodes 326, which are immersed in the electroetching solution may also have any geometrical shape and cross section. They may be in the form of mesh or even conductive foam.

During the process, the surface 303 is substantially parallel to the conductive surface of the wafer to perform uniform electroetching. Electroetching solution 308 contacts the process region 320b and establishes electrical contact between the electrode 326 and the process region 320b. The electroetching of the copper layer 102b is initiated when a potential is applied between the contact electrode, which becomes an anode and the process electrode, which becomes a cathode. The electrical current passes from contact electrode 309, into the electroetching solution 308 and enters the copper layer 102b at the contact region 320a. The current then flows in the copper film 102b towards the process region 320b, enters the electroetching solution 308 and flows to the cathode 326. Although, there may be electroetching solution between the surface 103b of the wafer and the top surface 303 of the holder 301, the resistivity of this electroetching solution is much higher than the resistivity of copper layer. If the distance between the surface of the holder structure and the surface of the wafer is small enough, such as 0.1-5 mm, the total resistance of this section of the etching solution will also be higher. Consequently, the electrical current will substantially follow the path through the copper layer and cause electroetching at the process region 320b. Any leakage of electrical current through the solution itself will reduce the efficiency of material removal since such leakage current would not result in electropolishing of the copper film. It should be noted that in this embodiment the electroetching solution is the common solution for the contact unit and the process unit and the units are in fluid communication through the electroetching solution that exists between the wafer surface and the top surface of the holder structure. As described before, the anodic voltage on the copper layer at the process region 320b causes electropolishing or electroetching of the copper in that region.

During the process, the wafer may be rotated and/or linearly moved over the holder structure 301 to accomplish uniform electroetching over the entire surface of the wafer. The process may be performed by bringing the wafer surface 103b in close proximity of the surface 303 of the holder 301 or even by contacting the surface 103b to the top surface 303 of the holder structure 301. If wafer surface is physically contacted to the top surface 303, it is preferable that the top surface comprises a pad material. With the selection of an appropriate pad, an electrochemical mechanical etching or polishing process can be carried out, which can planarize originally non-planar workpiece surfaces as discussed earlier, for electrochemical mechanical etching applications, a soft pad or a pad comprising abrasives on its surface may be employed.

The power sources 210 and 310 shown in FIG. 3A and FIG. 4A provide the power necessary to accomplish electropolishing. It should be understood that the various electrodes described may be all connected to a single power supply or multiple power supplies may be connected groups of electrodes to form zones, which may be controlled independently from each other. For example, a first group of process electrodes may be used to remove copper from the near-edge surface of the wafer and they may be connected to the negative terminal of a first power supply. A second group of process electrodes may scan the central region of the wafer surface to remove copper from this central region. This second group of process electrodes may be connected to the negative terminal of a second power supply. In this case, an electropolishing process may be carried out at the central region of the wafer using the second power supply and the second group of process electrodes. Then copper removal from the near-edge portion may be initiated powering the first group of process electrodes by the first power supply. Ability of independently removing material from multiple different zones on a wafer allows great flexibility in obtaining highly uniform electropolishing. Number of zones and number of electrodes per zone may be as small or large as practical. The contact electrodes may or may not be divided into different zones.

Figure 1A:
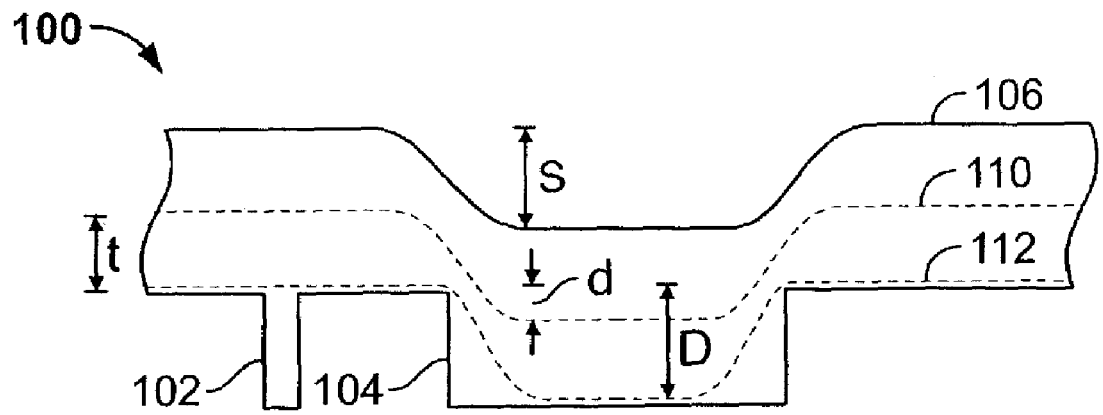
FIG. 1A is a schematic illustration of a substrate having a non-planar copper overburden layer which has been deposited using a conventional deposition process.

When the copper is removed from a certain zone on the wafer, the electrical current passing through that zone is expected to decrease, if voltage is constant. Alternately, if a constant current source is used as the power supply, as copper is removed from the surface, voltage drop is expected to increase. These changes in the current or voltage can be used to monitor the amount of material removed from the wafer surface. By knowing the position of a certain process area on the wafer surface at a certain time and the value of the current and voltage, one can determine the amount of copper left at that process region. If constant voltage supplies are used as power supplies, as the copper is removed by electroetching at a certain process area, the current value drops and therefore the electroetching rate also drops. This way, self-limiting of the electroetching process is achieved at regions of the wafer where copper is removed. This is important to avoid the copper loss from within the features as indicated in FIG. 1A.

FIG. 5 shows another exemplary electroetching or electropolishing system 400 that can be used to electrochemically etch the copper layer 102c. The system 400 comprises a plurality of contact and process units. In this embodiment, a common cathode, which is immersed in an electroetching solution, is used to electroetch the layer 102c through the process units and provides electrical power to the layer 102c through the contact units. This design is attractive especially for cases where material is being removed from the surface of the wafer and it gets deposited onto the common cathode. Since cathode is large and away from the wafer surface many wafers such as a few thousand wafers can be processed in this approach before the need to clean or replace the cathode. Referring to FIG. 5, a plurality of contact units 402 and process units 404 may be formed in a holder structure 401. The holder structure 401 in this embodiment is also shaped as a plate having a top surface 403 and a bottom surface 405. The system 400 is operated the way the system 300 is operated in the previous embodiment.

In the example shown in FIG. 5, the contact units 402 or contact nozzles are comprised of contact holes 406 formed in the holder 401. Contact electrodes 409 are placed inside the contact holes 406 and thus immersed in an electroetching solution 408. As mentioned before, in this embodiment, the electroetching solution 408 is used for both establishing contact with and electroetching the conductive layer 102c. The contact electrodes 409 are electrically connected to a positive terminal of a power source 410. In this embodiment, the process units 404 or nozzles are comprised of process holes 430 or process openings formed through the holder structure 401. The electroetching solution 408 fills the contact holes 406 as well as the process holes 430. During processing, contact holes are in close proximity of the wafer surface and they define contact regions 420a on the surface 103c of the conductive layer 102c. A common process electrode 426, which is the cathode, is placed in the reservoir and kept in physical contact with the electroetching solution 408. The process electrode 426 is electrically connected to a negative terminal of the power source 410. The electroetching solution 408 fills the process holes 430. In this embodiment, in order to minimize electrical current leakage from the contact electrodes through the electroetching solution to the process electrode, the contact electrodes may be placed very close to the wafer surface and insulating plugs 450 may be used below the contact electrodes. These insulating plugs may or may not be permeable by the solution. Wires connecting the various electrodes to the power supply are preferably isolated from the solution.

During processing, the top surface 403 of the holder 401 may or may not physically contact the wafer surface. If there is physical contact, it is preferred that the top surface 403 comprise a pad. It is also possible to use a fixed abrasive pad at the top surface to sweep the surface of the wafer to assist the material removal process, especially if planarization is required during copper electropolishing step. The holder 401 may itself be made of a pad material with process openings 430 and contact openings 406 cut into it. Contact electrodes 409 may then be placed into this pad. Contact electrodes may be placed very close to the top surface 403 to reduce voltage drop, but they should not protrude beyond the surface 403 to avoid physical contact with the surface of the copper layer 102c. Holder structures having various designs of process openings 430 and contact openings 406 may be employed as explained before.

FIGS. 6A through 9B depict some of these different holder structures having various contact and process unit designs. As in all above embodiments, in the following embodiments, the contact electrodes in the contact units do not physically contact the wafer surface that is electropolished. The electrical conduction between the surface of the wafer under process and the contact electrodes is provided through the process solution that is touches the contact electrodes and the surface.

Figure 6A:
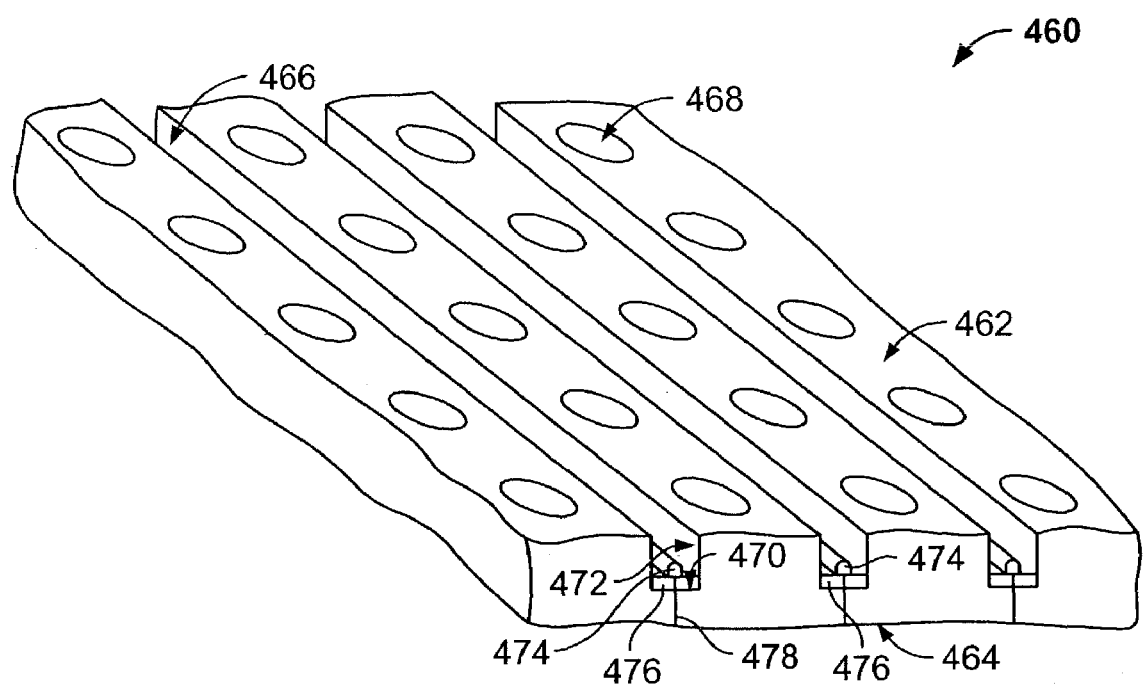
FIGS. 6A-6B are schematic illustrations of a holder structure used with the electropolishing system of the present invention.
Figure 6B:
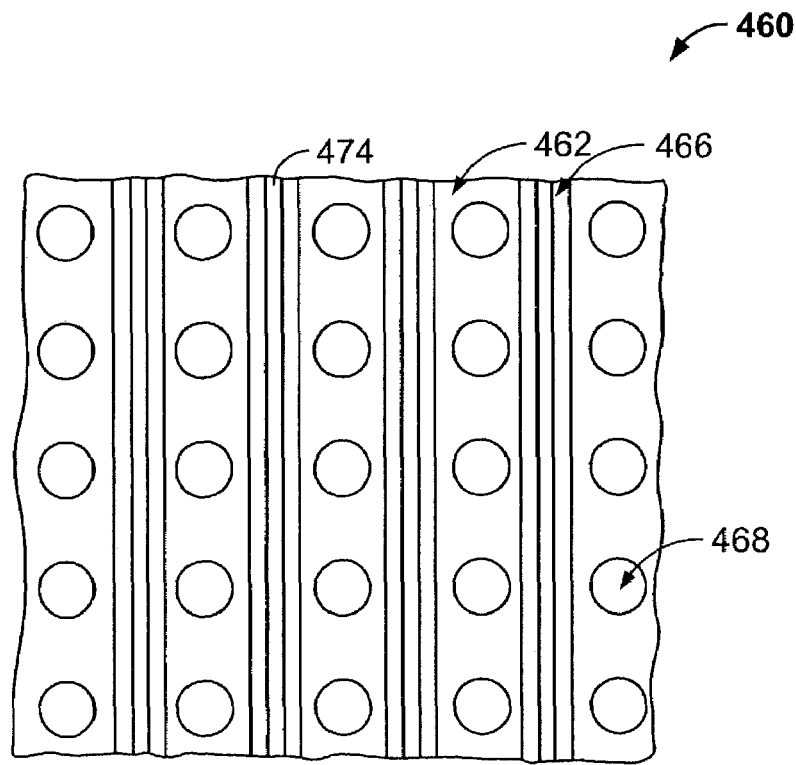

As illustrated in one embodiment, in FIG. 6A in a perspective view and in FIG. 6B in plan view, a holder structure 460 has a top surface 462 and a bottom surface 464. A number of contact units 466 are formed in the top surface 462 of the holder structure 460. Further, a number of process units 468 are formed through the holder structure 460 and between the top surface 462 and bottom surface 464. In this embodiment, the contact units 466 are channels, preferably near-rectangular in cross-section, having a bottom wall 470 and side walls 472. Although in this embodiment, the channels are distributed parallel and separated one another equidistantly, they may be distributed in any manner such as non-parallel or radial and the distance between the channels may vary. The contact electrode 474 is placed in the channel 466, preferably on the bottom wall 470. The electrodes are shaped as bars or wires extending along the channels. Although it is not necessary, there may be a contact base 476 between the electrode 474 and the bottom wall 470. The contact electrodes may be directly placed on the bottom wall 470. If there is, the base 476 may be extended down to the bottom surface of the holder structure 460 and may be made of an insulator. The height of the electrode is at the level of the surface 462 or slightly less than the depth of the channel so that during the process the electrode cannot touch the wafer surface that is electropolished but allow current flow through the process solution. An insulated wire 478 connects the electrode to a terminal of a power supply (not shown). In this embodiment, the process units 468 may be shaped as round holes extending through the holder structure and allowing solution flow to the top surface. Holes 468 may be rectangular or any other geometrical form, including slits. Process units may also be continuous slits in between the channels 466.

It should be noted that the designs of FIGS. 6A, 6B, 7A, 7B, 8A, 8B, 9A, 9B, 10A and 10B will be described as applied to the concept shown in FIG. 5, namely, a design with one cathode and multiple contact electrodes. It will be appreciated, however, that the designs and concepts shown in FIGS. 6A-10B are also directly applicable to the cases shown in FIGS. 3A, 3B, 3C, 3D, 3E, 3F, 3G and 4A. For example, in the embodiment shown in FIG. 6A, every other channel 466 may be made a contact unit (shown as 302 in FIG. 4A) with a contact electrode 474 in it (shown as 309 in FIG. 4A). In between these contact units then, every other channel 466 could be a process unit (shown as 304 in FIG. 4A), and the electrodes within these process units would be the process electrodes (shown as 326 in FIG. 4A). In this case solution would be fed through the openings (shown as 468 in FIG. 6A), and power would be applied between contact electrodes and process electrodes as shown in FIG. 4A. In this case, a single power source can be used if all contact electrodes are connected together and all process electrodes are connected together. Alternately, as discussed earlier, multiple power supplies can be used to power multiple contact electrode-process electrode pairs, or a single power supply may be switched between various pairs of contact electrode-process electrode.

Figure 7A:
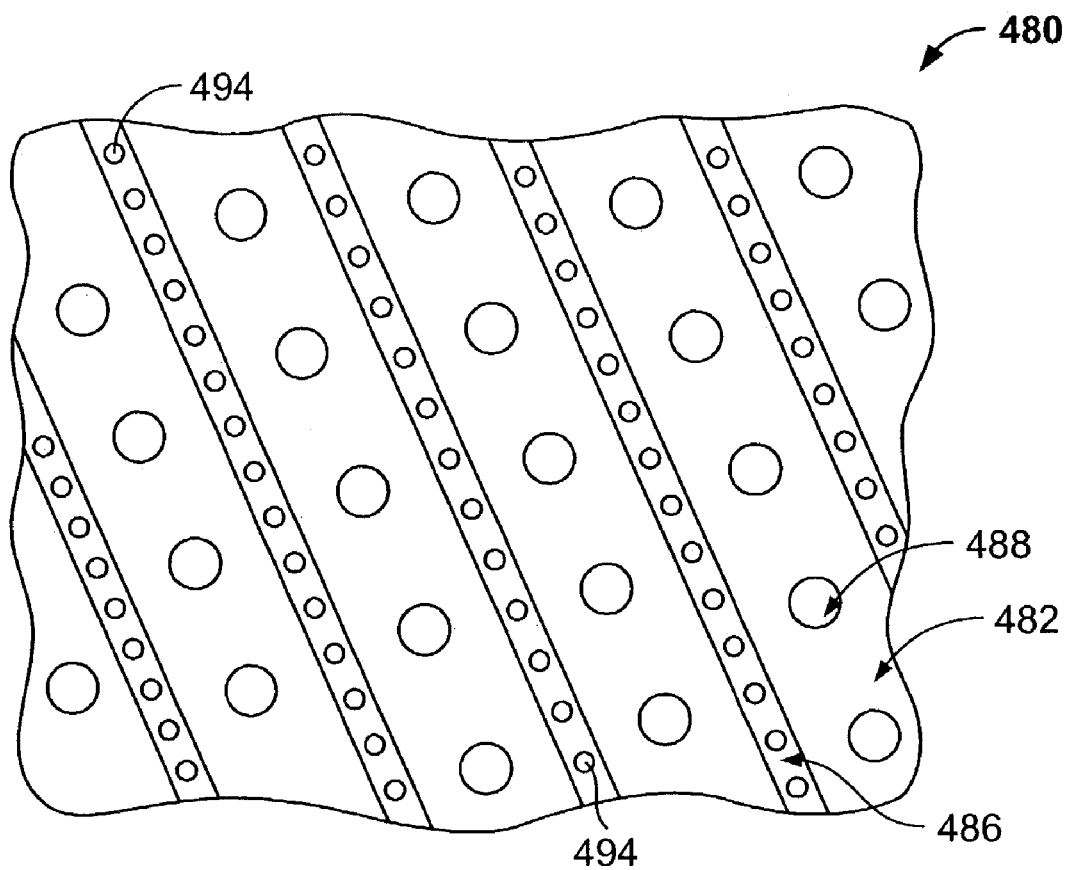
Figure 7B:
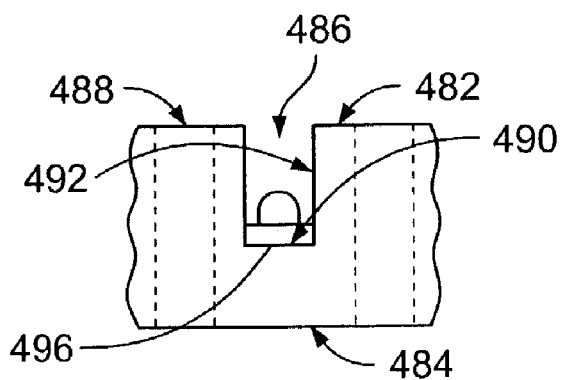

FIG. 7A shows, in plan view and FIG. 7B in partial cross section, another embodiment of a holder structure 480, which is a variation of the holder structure 460 shown in the previous embodiment. The holder structure 480 comprises channels 486 and holes 488. The channels in this example are placed in diagonal fashion and equidistantly parallel to one another. The channels 486 are in rectangular shape and are defined by a bottom wall 490 and side walls 492, as shown in FIG. 7B. Contact electrodes 494 are shaped as beads that are lined along the bottom of the channels 486 and connected a terminal of a power supply (not shown). As described above, the contact electrodes 494 may or may not be placed on an electrode base 496.

Figure 8A:
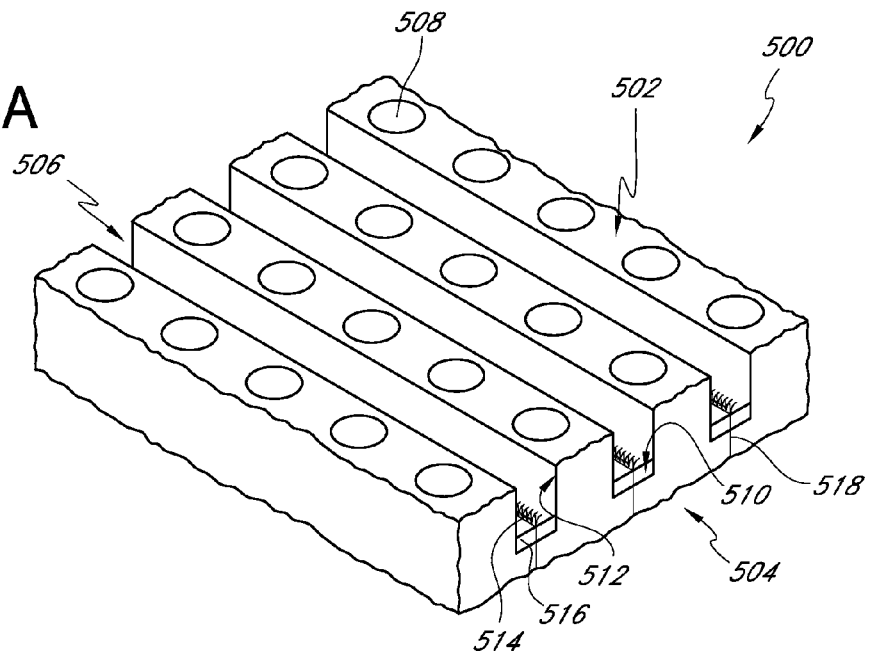
FIGS. 8A-8B are schematic illustrations of another holder structure used with the electropolishing system of the present invention.
Figure 8B:
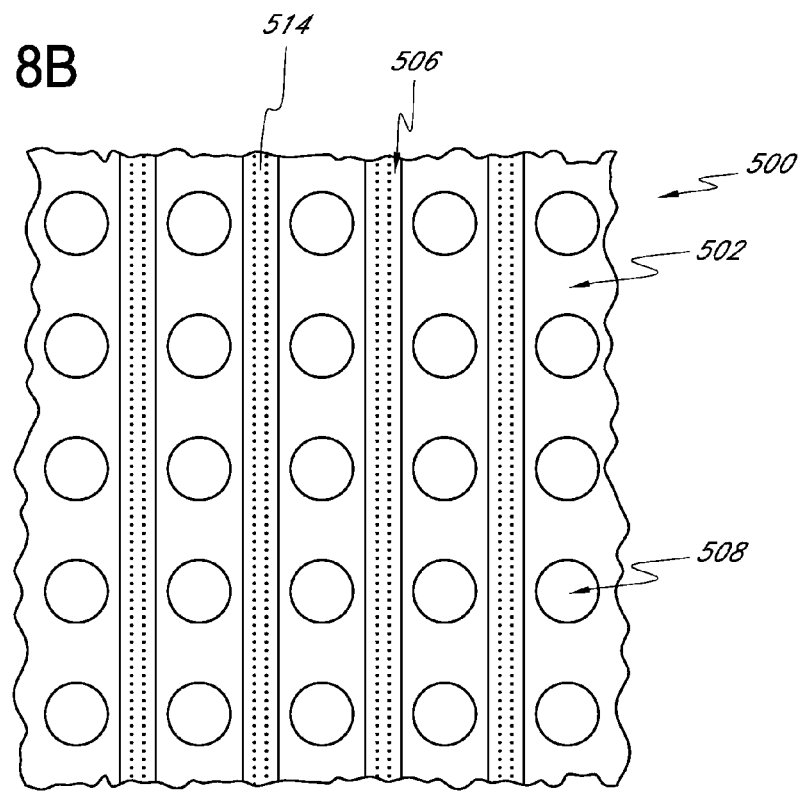

FIGS. 8A-8B illustrate another embodiment of a holder structure 500. In FIG. 8A in a perspective view and in FIG. 8B in plan view, the holder structure 500 has a top surface 502 and a bottom surface 504. A number of contact units 506 are formed in the top surface 502. Further, a number of process units 508 are formed through the holder structure 500 and between the top and bottom surfaces 502, 504. In this embodiment, the contact units 506 are channels, preferably rectangular cross-section, having a bottom wall 510 and side-walls 512. As in the previous embodiments, the channels are distributed parallel and separated one another equidistantly, they may also be distributed in any manner such as non-parallel or radial, and the distance between the channels may vary. In this embodiment, contact electrodes 514 are preferably conductive brushes made of thin conductive wires or bristles. The contact electrodes 514 are placed in the channel 506, preferably on the bottom wall 510. As in the previous embodiments, there may be a contact base 516 between the conductive brushes 514 and the bottom wall 510. The height of the conductive brushes 514 is preferably slightly less than the depth of the channel 506 so that during the process brushes 514 cannot touch the wafer surface that is electropolished but allow current to flow through the process solution. As in the previous embodiments, the base 516 may be extended down to the bottom surface of the holder structure 500 and may be made of an insulator. An insulated electrical line 518 connects the conductive brushes to a terminal of a power supply (not shown). In this embodiment, the process units 508 may be shaped as round holes extending through the holder structure and allowing solution flow to the top surface during the process. Holes 502 may be rectangular or any other geometrical form.

Figure 9A:
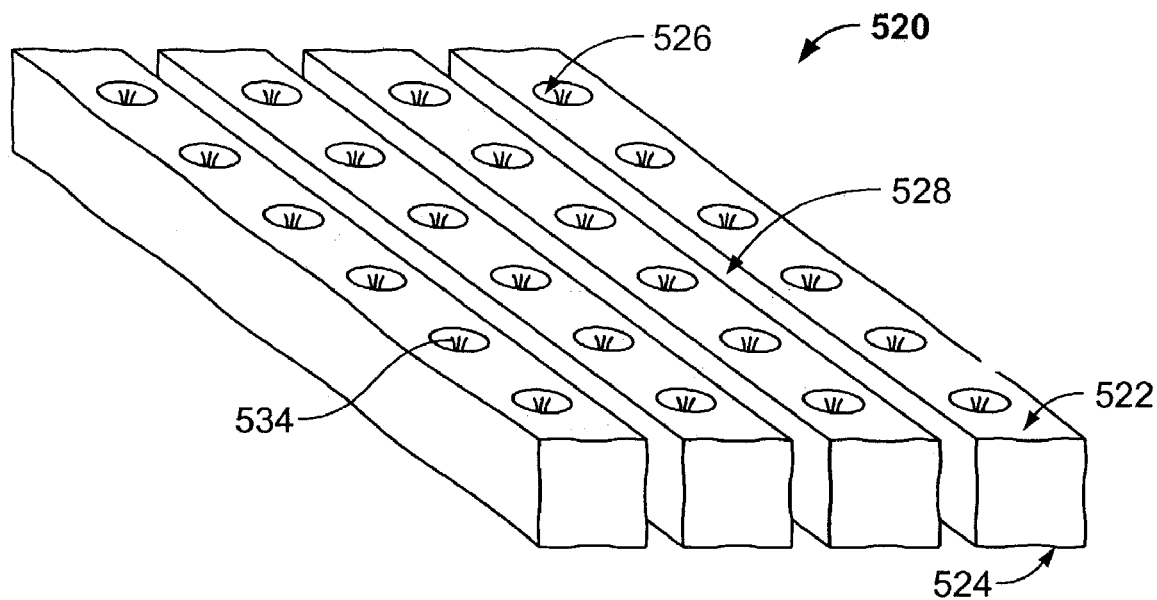
FIGS. 9A-9B are schematic illustrations of yet another holder structure used with the electropolishing system of the present invention.
Figure 9B:
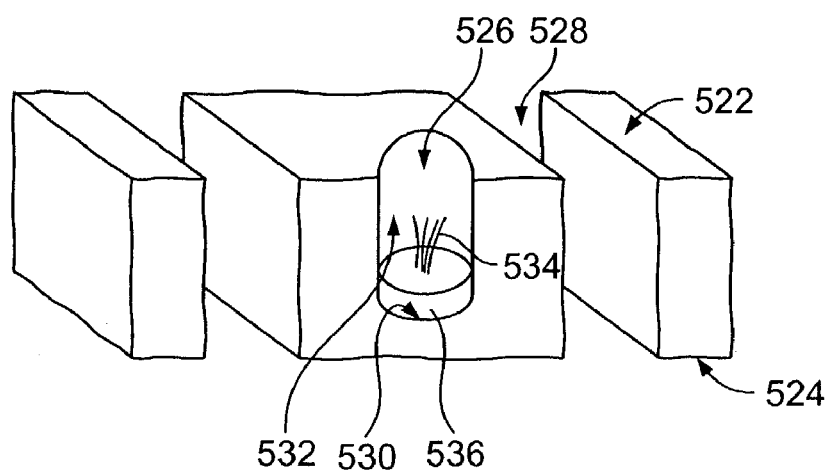

FIGS. 9A-9B illustrate another embodiment of the holder structure using conductive brushes that are used in the previous embodiment. Of course, use of conductive brushes is for the purpose of exemplifying subject embodiment. Contact electrodes with any other shape and geometry may be used with the embodiments described in connection to FIGS. 9A-9B. Similarly, use of different shape, size and geometry of process units and contact units as well as their possible distribution alternatives on the holder structures are within the scope of this invention.

As illustrated in FIG. 9A in perspective view and in FIG. 9B in a partial perspective side view, a holder structure 520 is a variation of the holder structure 500 shown in the previous embodiment. The holder structure 520 comprises contact units 526 and process units 528. The process units 528 in this example are placed in diagonal fashion and equidistantly parallel to one another. The process units in this embodiment are shaped as slits extending between the top and bottom surfaces 522, 524 of the holder structure 520 and allowing process solution to flow. The contact units in this embodiment are shaped as holes in the holder structure. The contact units 526 include a bottom wall 530 and side-wall 532 which is cylindrical in this example. Conductive brushes 534 are placed on the bottom wall 530 of the contact units 526 and connected to a terminal of a power supply (not shown). As described above, the contact electrodes 534 may be placed on an electrode base 536.

Figure 10A:
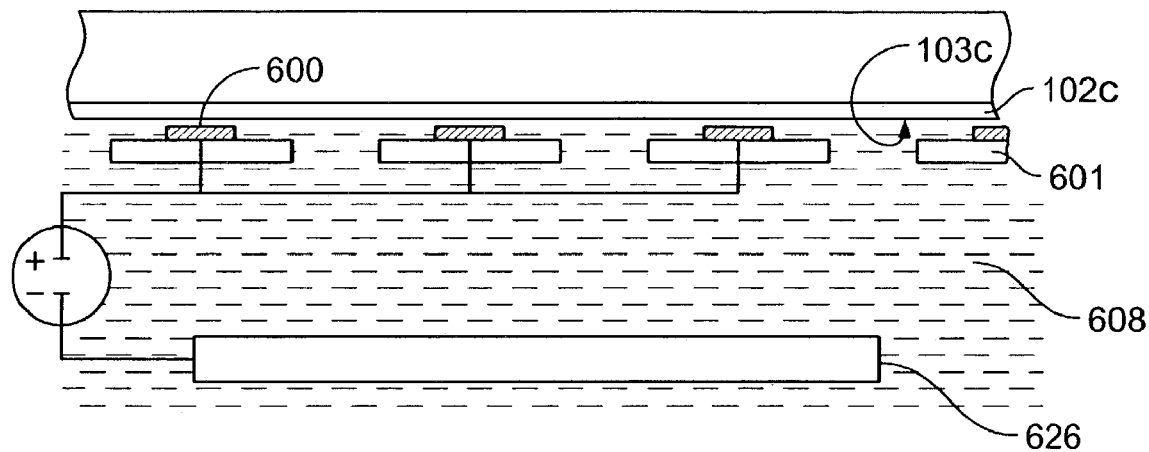
FIG. 10A-10B are schematic illustrations of other embodiments of an electropolishing system of the present invention using multiple contact electrodes with a single process electrode.
Figure 10B:
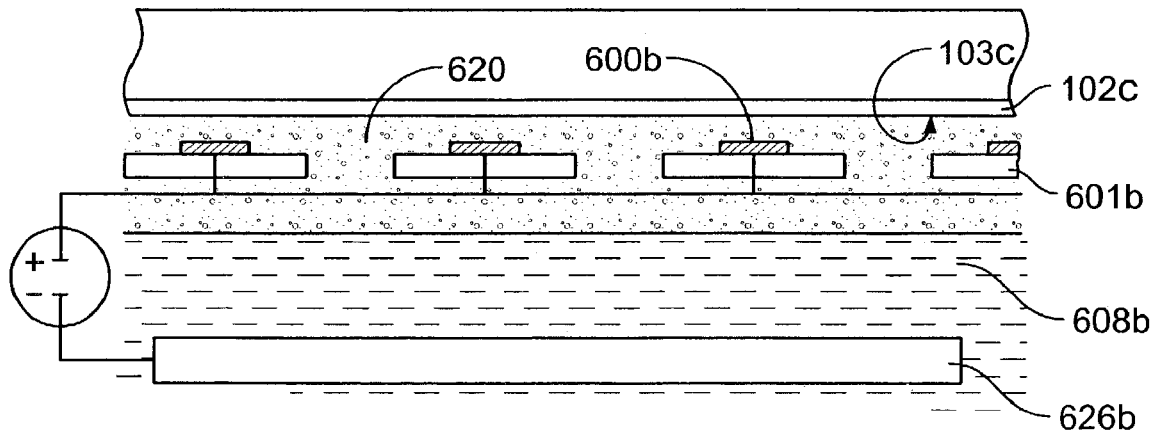

Two other designs that employ the buried electrical contact concept of the present invention are shown in FIGS. 10A and 10B. As shown in FIG. 10A, contact electrodes 600 are over supports 601 and they are in close proximity of the surface 103*c* of the copper layer 102*c*. The supports 601 may be held by a holder structure (not shown), which may be made of an open frame. Supports 601 are made of insulating material and they reduce the electrical current leakage that may flow from the contact electrodes 600 through the electropolishing solution 608, to the electrode 626 when a voltage rendering the contact electrodes anodic is applied between the electrode and the contact electrodes. In operation, contact electrodes 600 do not touch the surface 103*c*. However, close proximity of them to the surface electrically couples the contact electrodes 600 to the copper surface 103*c*. As in previous examples, most of the material removal takes place on the wafer surface in the area in between the contact electrodes, i.e., process openings. Reduction of leakage current is important in this design. Such reduction may be achieved by insulating all surfaces of contact electrodes except the surface facing the wafer and by reducing the distance between the wafer and the contact electrodes. A version of the design in FIG. 10A that can be used for touchprocessing is shown in FIG. 10B. In FIG. 10B, the contact electrodes 600*b* and structures 601*b* are buried in a spongy material 620 or a pad material. The spongy material may be a porous polymeric pad that allows the electroetching solution 608*b* to wet the wafer surface as well as the contact electrodes 626*b*. During electropolishing, the surface of the copper layer 102*c* may or may not touch the surface of the pad material. Again, in this embodiment, most of the material removal takes place on the wafer surface in the area in between the contact electrodes, i.e., process openings, which may contain the spongy material as shown in FIG. 10B, or spongy material may be removed from these process openings to reduce electrical resistance and resistance to flow of the electrolyte. The surface of the pad material may comprise abrasives to assist material removal process, especially if planarization is required during electropolishing, i.e., the starting copper surface is non-planar.

Figure 1B:
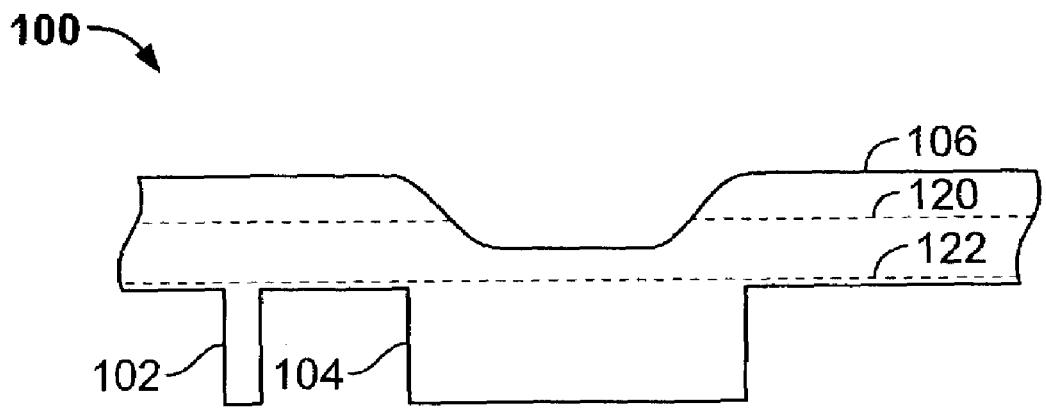
FIG. 1B is a schematic illustration of the substrate shown in FIG. 1A wherein a planarization process has been applied to the non-planar copper overburden layer.
Figure 1C:
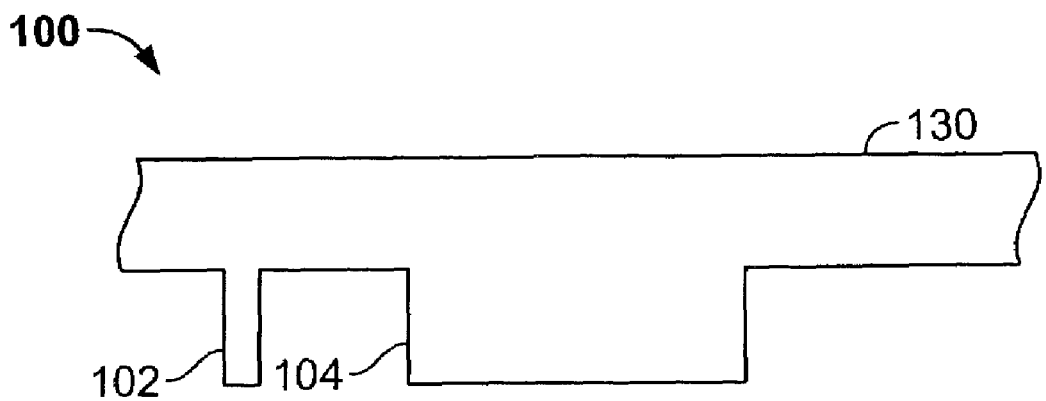
FIG. 1C is a schematic illustration of a substrate having a planar copper overburden layer which has been deposited using an electrochemical mechanical deposition process.

FIGS. 1A and 1B schematically illustrates exemplary stages of an electropolishing process using the system described in FIG. 10A. In this example for the purpose of clarification, a system 700 with two contact electrodes, a first contact electrode 701*a* and a second contact electrode 701*b*. The electrodes are placed on supports 702 and connected to a positive terminal of a power supply. In this respect, a cathode electrode 705 is also connected to a negative terminal of the power supply. Since the electropolishing process is exemplified with two contact electrodes, a portion of cathode electrode 705 is shown in FIGS. 11A-11B.

Electropolishing process is applied to an exemplary substrate 704 having a copper layer 706. The material removal takes place on the wafer surface in a process opening 707 in between the contact electrodes. The substrate 704 may be a semiconductor substrate including features 708 filled with copper layer. The features 708 and the surface of the substrate 704 may be lined with a barrier layer 710, which has generally a lesser conductivity than the conductivity of the copper. As described before, Ta, W, WN, WCN or TaN are the typical barrier materials for copper deposition. A copper removal solution such as an electropolishing solution 712 is in contact with the copper layer 706 and the cathode electrode 705 (see also FIG. 10A).

Figure 11A:
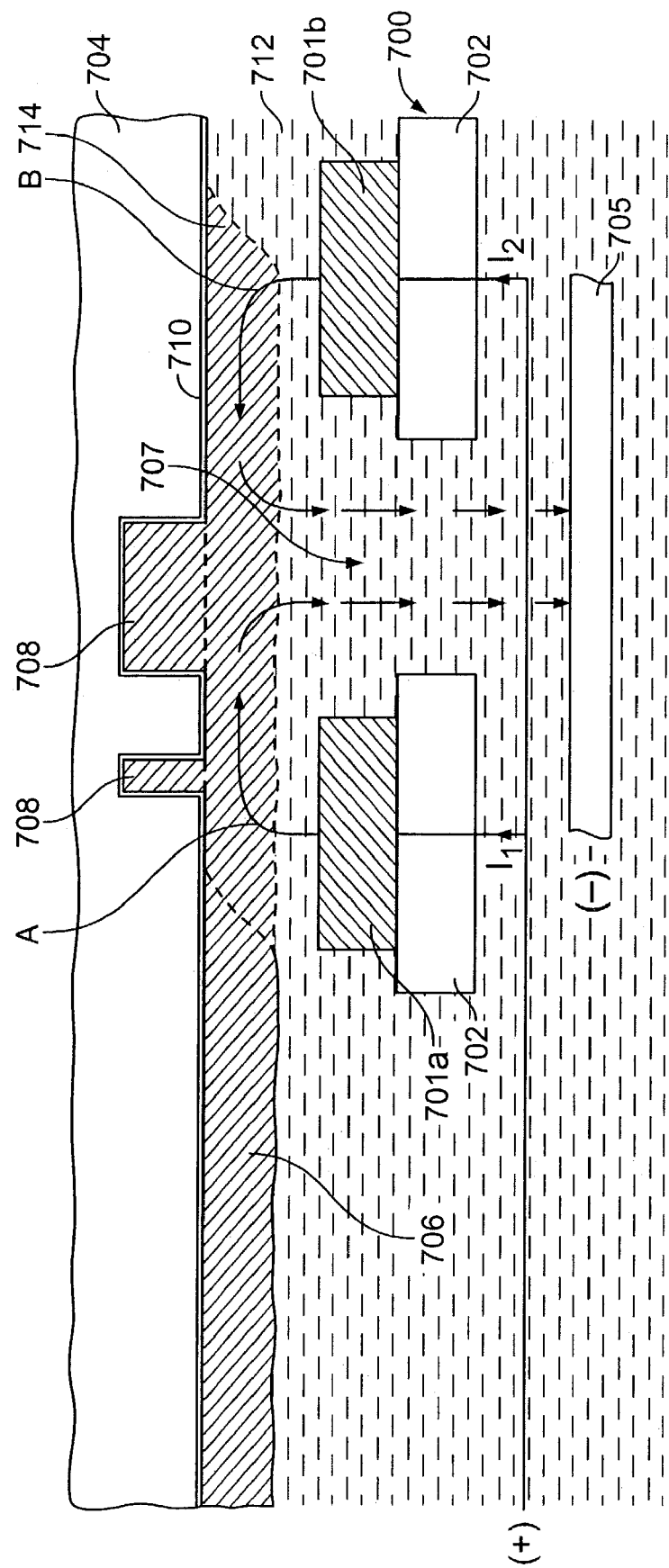
FIGS. 11A-11B are schematic illustrations of stages of an electropolishing process using the electropolishing system shown in FIG. 10A.
Figure 11B:
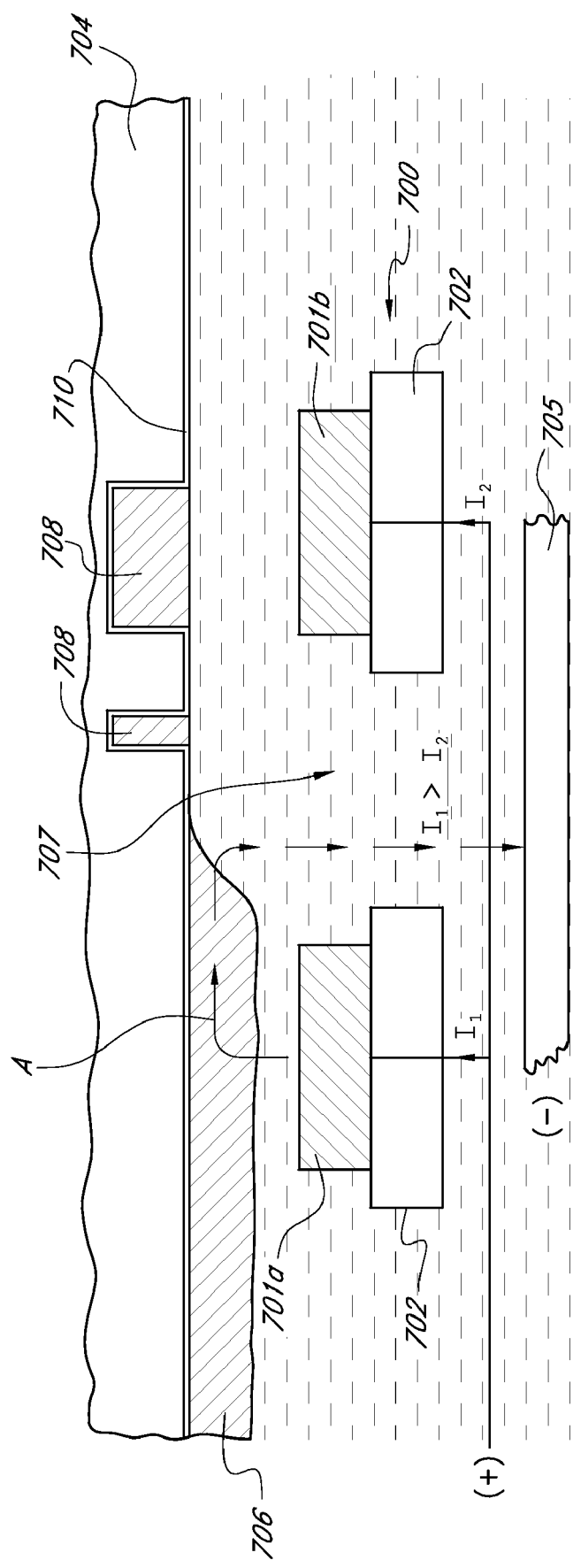

As shown in FIG. 11A, during an instant of the electropolishing process the contact electrodes 701*a* and 701*b* are placed in close proximity of the copper layer. As the current from the contact electrodes 701*a* and 701*b* flow through the copper layer 706, a surface portion 714*a* of the copper layer 706 is removed or electropolished. The surface portion is the portion of the copper layer that is located across the process hole 707 and the contact electrodes. As shown in FIG. 1A, direction of the current flow from the first contact electrode 701a and the second contact electrode 701b is depicted with the arrows A and B respectively. The electropolishing uniformly reduces the thickness of the copper layer down to the barrier layer level and continues as long as conductive copper remains on the barrier layer. It will be appreciated that during the removal of the portion 714, resistance against the current flow increases and the current flow chooses the least resistive path where it may still have conductive copper and continues etching the remaining copper until the surface portion 714 is almost entirely removed. This brings the electropolishing of the copper layer to a stop at that location of the surface, i.e., process self-limits, before moving over the neighboring location as shown in FIG. 11B. FIG. 11B shows another instant during the electropolishing process, as the system 700 moves over the remaining portion of the copper layer 706. As the contact electrode 701a moves over the copper layer 706, current flows through the remaining layer and starts electropolishing process. At this instant, since the second contact electrode is still over the exposed barrier layer, current flow from the second electrode faces resistance. This causes a larger current $I_1$ to flow through the first electrode 701a and through the path A compared to the current $I_2$ that flows through the second electrode 701b. The current flow from the first contact electrode causes electropolishing of the remaining copper, whereas the small current or lack of current through the electrode 701b arrests further copper removal from the areas where barrier is exposed. Accordingly, the system 700 is able to reduce and increase the current flow from a particular contact electrode depending on the remaining copper across that particular electrode as the process progresses and once the barrier is exposed copper removal is drastically reduced or arrested to avoid copper loss from within the features 708.

Figure 12A:
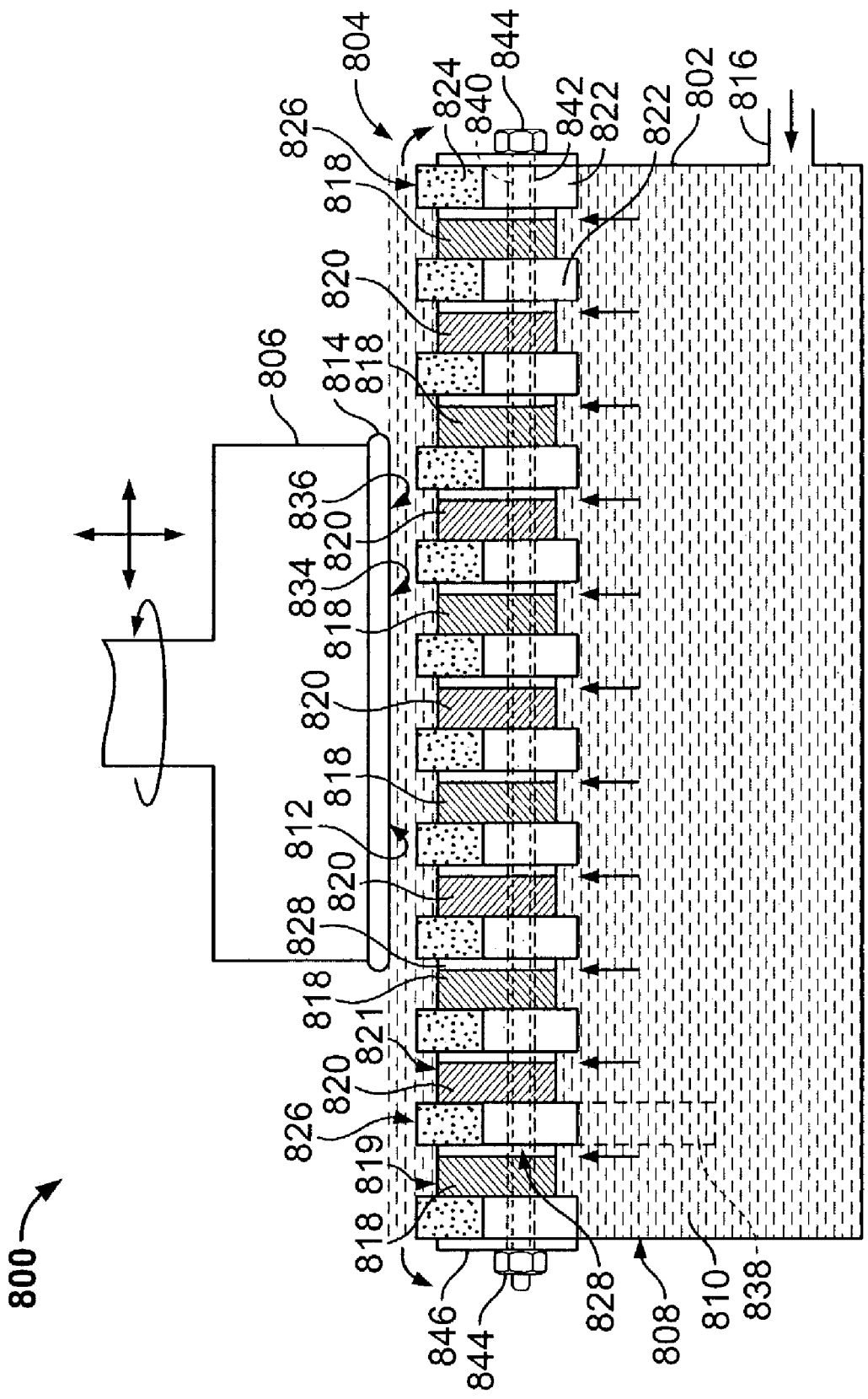
FIG. 12A is a schematic side view of an electropolishing system of the present invention wherein a holder structure of the system includes and array of contact and process units.
Figure 12B:
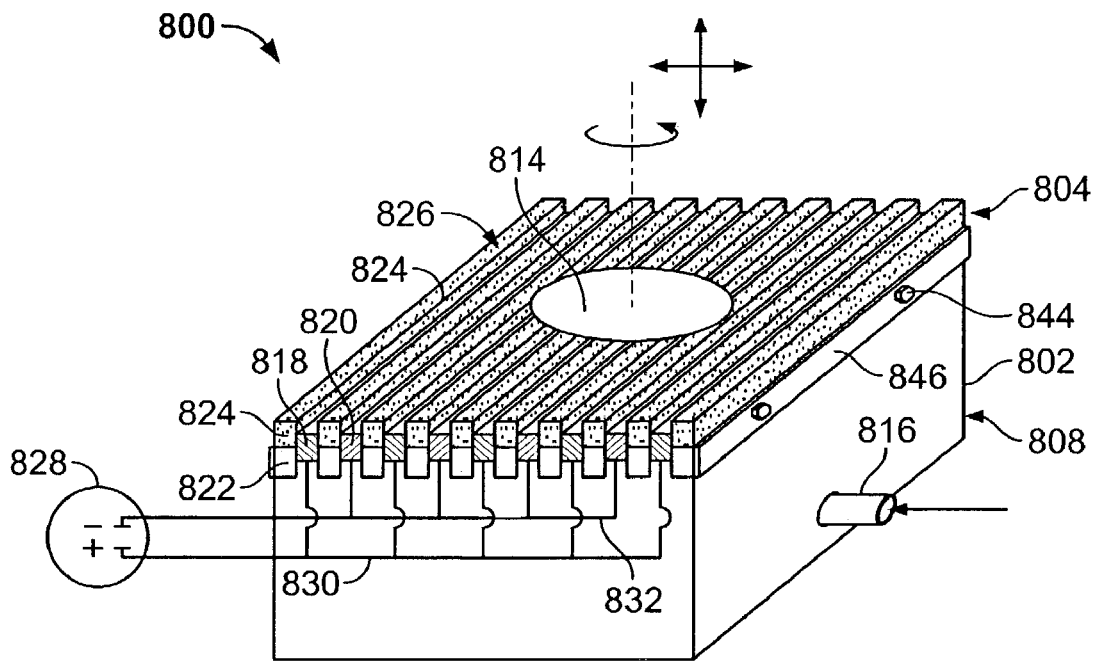
FIG. 12B is a schematic perspective view of the system shown in FIG. 2A.
Figure 12C:
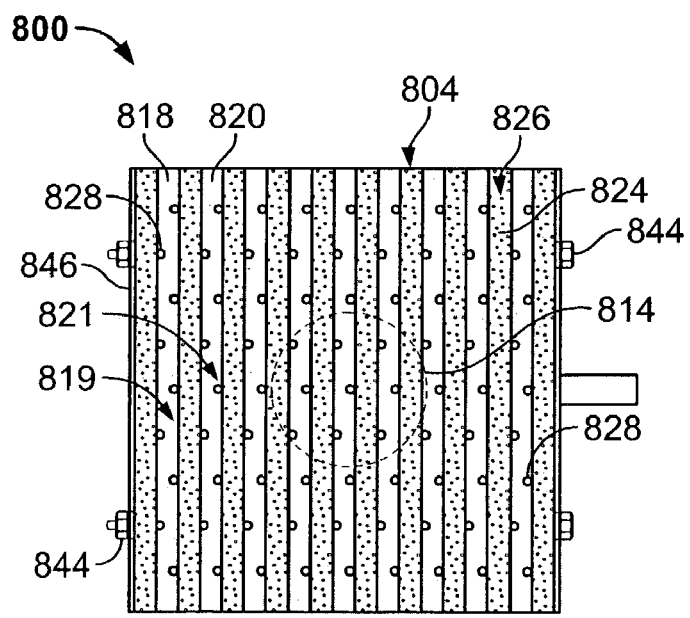
FIG. 12C is a top plan view of the system shown in FIG. 12B.

FIGS. 12A-12C illustrate an exemplary non-contact electropolishing system 800 of the present invention. As shown in FIG. 12A in a side view, the system 800 comprises a solution container 802, a holder structure 804 and a wafer carrier 806. The holder structure 804 is placed on the side walls 808 of the solution container 802 which contains a process solution 810, preferably an electropolishing or electroetching or electrochemical mechanical polishing solution. The process solution 810 flows through the holder structure and wets front surface 812 of the wafer 814 during the process. The diameter of the wafer, or wafer size, may be any size such as 200 mm or 300 mm or larger. The front surface 812 comprises a conductor, such as copper, tantalum, tungsten and other materials commonly used in electronics industry. The process solution 810 is delivered to the container 802 through a solution inlet 816. The solution 810 leaves the system from the edges of the holder structure 804 and filtered and pumped back to the container 802 from a recycle unit (not shown). The wafer carrier 806 can rotate and move the wafer laterally or in orbital fashion in proximity of the holder structure 804.

In this embodiment, the holder structure 804 is comprised of a plurality of contact electrodes 818 and process electrodes 820 that are separated and electrically insulated from one another by insulation members 822. The contact electrodes 818 and the process electrodes 820 have top surfaces 819 and 821 respectively. Except the top surfaces 819 and the 821, the electrodes 818 and 820 are coated with an insulating film such as a Teflon™ film. In this embodiment, all of the top surfaces 819 and 821 are leveled and substantially coplanar.

As shown in FIGS. 12B and 12C, which are perspective and top plan views of the system 800, the contact electrodes and the process electrodes are made of conductive rods that are separated by insulating members 822 which are also shaped as rods. The widths of the contact electrodes, process electrodes and the insulating members may be in the range of 1-10 mm. Referring back to FIG. 12A-12C, a compressible layer 824 is also attached to the holder structure 804, in between the contact and process electrodes. The compressible layer 824 is preferably made of strips of a compressible and insulating material, such as polyurethane, and attached on top of the insulation members. The compressible material of the strips also has a closed pore structure, which does not allow solution to flow through it and therefore also limits any leakage current that may pass between the contact electrodes and adjacent process electrodes, forcing the current to pass through the conductor on the workpiece surface. The compressible layer will be referred to as compressible layer strips hereinafter. Top surfaces 826 of the compressible layer strips 824 are all substantially coplanar. The top surfaces 826 of the compressible layer strips 824 are above the top surfaces 819 and 821 of the contact and process electrodes by an amount that may be in the range of 1-10 mm, preferably 2-5 millimeters. In this respect, top surfaces of the contact electrode rods between the compressible layer strips define contact units and, top surfaces of the process electrode rods between the strips define process units of the electropolishing system 800. As described earlier, the contact electrodes do not physically contact the surface of the wafer. However, the surface of the compressible layer strips 824 may touch the surface of the wafer during polishing stage. Due to the closed pore structure of the strips, very little or no electrical current flows between the contact units and the process units, directly through the compressible layer strips. The tops of the strips 824 preferably contain a suitable pad material that efficiently sweeps the substrate surface when a contact is established between the tops of the strips and the substrate surface.

As shown in FIG. 12B, contact electrodes 818 are electrically connected to a positive terminal of a power source 828 through a first electrical contact 830. The process electrodes 820 are connected to a negative terminal of the power source 828 using a second electrical contact 832. It should be noted that instead of the polarity stated above, a variable polarity may also be applied to the two terminals. In other words a variable voltage or an AC voltage may be applied between the contact and process electrodes. As will be described below, multiple electropolishing zones may be established on the holder structure (see FIG. 13).

The process solution provides the conductive path that allows current to pass between the contact and process electrodes and the conductive surface. As shown in FIGS. 12A and 12C, the process solution flows through openings 828 provided in the holder structure 804. The openings are preferably formed through the contact electrodes 818 and process electrodes 820, although they may also be opened through the insulating members 822 and the compressible strips 826. As in the above embodiments, the process solution is used for both establishing electrical contact and electrochemical processing of the conductive layer.

As described above, electrical contact to the wafer surface is established through the contact electrodes while the electrochemical processing of the surface is performed over the process electrodes. During the process, the surface 812 of the wafer is placed in close proximity of the top surface of the compressible strips 824. In this position the surface 819 of the contact electrodes are positioned across contact regions 834 of the surface 812 while the process electrodes are positioned across the process regions 836 of the surface 812 (see FIG. 12A). Since the holder structure 804 and the wafer 814 are moved relative to one another during the process, the contact regions and process regions may be at any appropriate location on the surface of the wafer and may be at any location at a given instant. As the process solution wets the contact region, the solution establishes electrical contact between the contact electrode and the contact region since the solution is selected to be conductive. In this respect, the current flows from the contact electrodes and through the process solution to the surface, and then through the process solution to the process electrodes. Although both electrodes are coated with an insulating film, except at the top surfaces facing the substrate, an extended isolation member 838 may be used between the contact and process electrodes to further assure minimum leakage current between these electrodes at their bottom ends. This way the pathway for any possible leakage current between the bottom ends of the electrodes is made longer, increasing the resistance. To reduce the overall leakage of the assembly, all isolation members may be made extended type.

With predetermined intervals, the top surface of the holder structure 804 may be cleaned and conditioned using a pad cleaner/conditioner or a platen surface cleaner to remove particulates dispersed or formed on the holder structure during the electropolishing or electrochemical mechanical polishing process. Such particulates may be small pieces of conductor deposits formed on the pad surfaces or electrode surfaces. Designs such as those used for cleaning pads employed in ECMD and ECME processes disclosed in our recent patent applications are applicable to the present case.

Referring to FIG. 12A-12C, rods forming the contact and process electrodes as well as the isolation members are all fastened together as an array of alternating process and contact electrodes which are separated by the isolation members. Although many alternative fastening methods may be used, in this embodiment, a pin and nut combination may be used to fasten the electrodes and the isolation members together.

As shown in FIG. 12A, a number of pins 840 are placed through holes 842 extending through the electrode and the isolation member rods and locked in place by tightening nuts 844. The holes extend perpendicular to the longitudinal axis of the array of rods. End plates 846 may be placed at both ends of the array of electrodes and the isolation members to tighten the array of electrodes and the isolation members more uniformly.

It should be noted that ability of placing pad materials at the top surface of compressible strips allow application of uniform and low force on the wafer surface when this surface makes contact with the pad material during process. In this case, the wafer surface is brought in contact with the pad material surface and then pushed against it. Once the pad strips on top of the compressible layer strips are pushed down by the wafer surface by a predetermined distance, force generated by the compressible layer strips pushes the pad material against the wafer surface. The amount of force depends on the spring constant of the compressible material and can be pre-selected by selecting harder or softer compressible materials of the strips. This design assures good and uniform physical contact between the pad material and the wafer surface.

Figure 13:
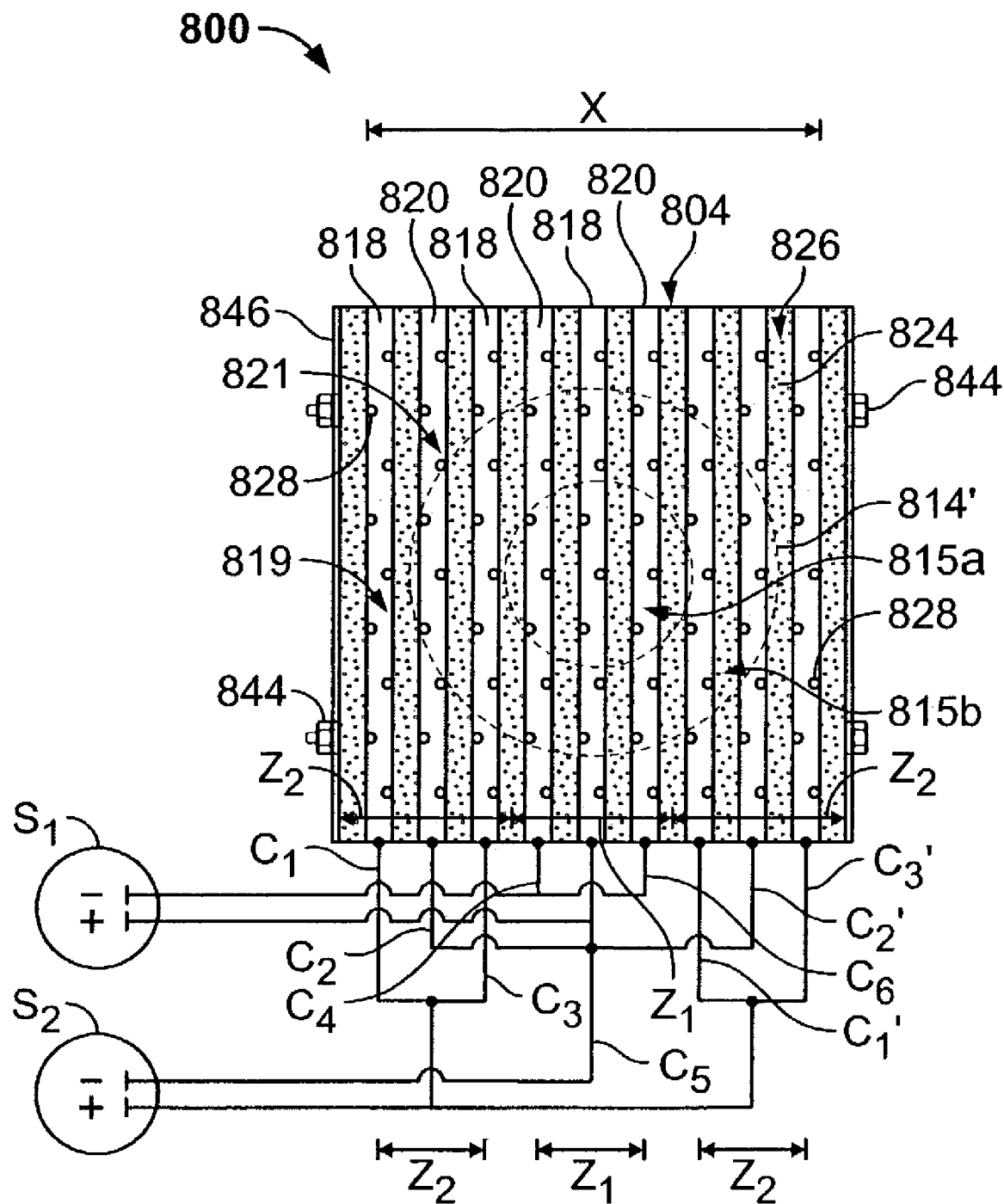
FIG. 13 is a schematic illustration of the holder structure shown in FIGS. 12A-12C, wherein the holder structure has multiple electropolishing zones.

FIG. 13 illustrates an embodiment of the holder structure 800 with multiple electropolishing zones. In one embodiment, multiple electropolishing zones may be established by dividing the surface area of the holder structure into different zones such as zones $z_1$ and $z_2$. For example zone $z_1$ may electropolish a center region 815a of the surface of the wafer 814' and the zone $z_2$ may electropolish an edge region 815b of the same surface. As shown in FIG. 13, the zone $z_1$ may cover a center area of the holder structure and extends longitudinally from the beginning to the end of the electrodes. Zone $z_2$ may be the rest of the surface area located at both sides of the zone $z_1$. Electrodes in zone $z_1$ are connected to terminals of a power source $S_1$, and the electrodes in the zone $z_2$ are connected to terminals of a power source $S_2$. In this respect, lines $C_1$, $C_3$, $C_1'$ and $C_3'$ electrically connect the contact electrodes 818 in zone $z_2$ to a positive terminal of the power source $S_2$. Lines $C_2$ and $C_2'$ electrically connect the process electrodes 820 in zone $z_2$ to a negative terminal of the power source $S_2$. Similarly, lines $C_4$ and $C_6$ electrically connect the process electrodes 820 in zone $z_1$ to a negative terminal of the power source $S_2$. Line $C_5$ connects the contact electrode 818 in zone $z_1$ to a negative terminal of the power source $S_1$. During the electropolishing process, as the wafer 814' is rotated and moved laterally in the x-direction, uniformity of the electropolishing is controlled by varying the voltage in zones $z_1$ and $z_2$. Varying the voltage in the zones $z_1$ and $z_2$, in turn, vary the electropolishing rate in the center region 815a and edge region 815b of the wafer.

As described above and shown in FIG. 5, process units may be established as openings in the holder structure. In such holder designs, a common cathode electrode works through the openings or the process units. The same inventive approach is also applicable to the holder structure 804 that is illustrated in FIGS. 12A through 12B. In order to form the process openings, the process electrodes 820 are removed from the holder structure and small spacers are placed, preferably, between the insulating members 822 to form the openings. Two spacers maybe used one at each end of the insulating members. Alternately, more spacers may be used at specific intervals. This is possible as long as the spacers are narrow and do not shade the wafer surface from the field going to the process electrode. Similar end result may be obtained by using insulating members having holes or slits and placing them between the contact electrodes 818 after the removal of the process electrodes 820. In a following step a single process electrode (cathode) is placed in the process solution 810 to complete the system.

Figure 14A:
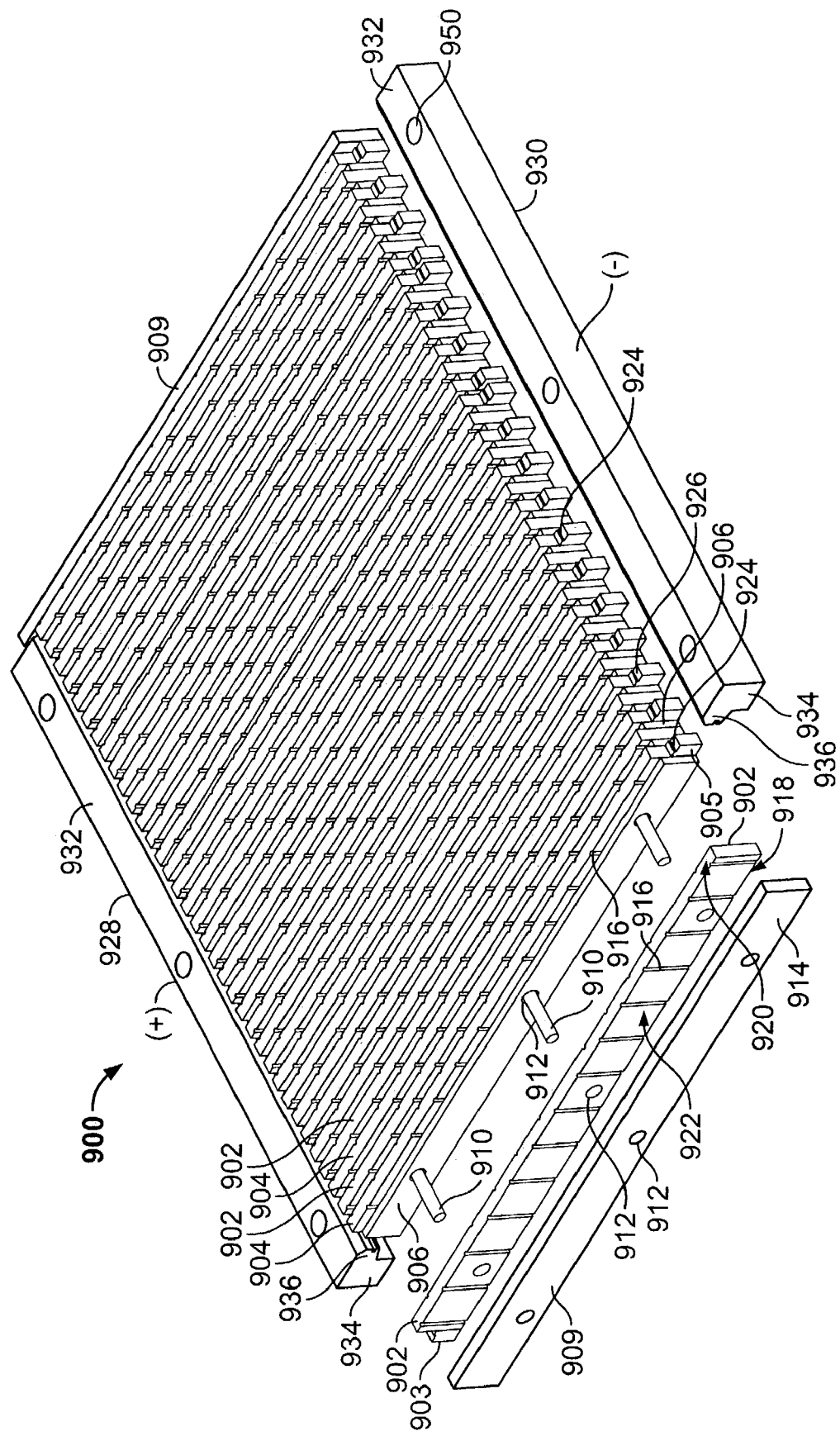
FIG. 14A is a schematic perspective view of an embodiment of an holder structure including an array of electrodes and insulating members.
Figure 15:
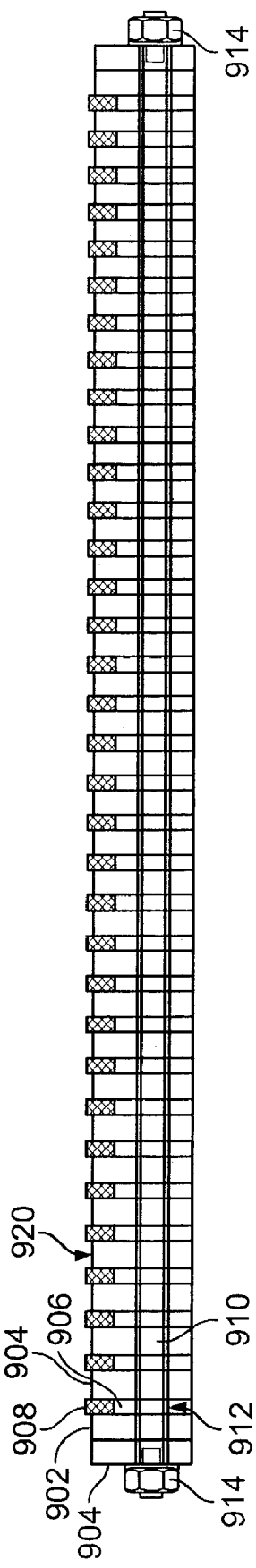
FIG. 15 is a schematic cross sectional view of the array of the holder structure including a compressible material layer.

FIG. 14A illustrates an embodiment of an array 900 of contact electrodes 902, process electrodes 904 as well as isolation members 906. The array 900 can be used to form a holder structure that also includes compressible strips (not shown). In this embodiment, for the purpose of clarity the pad strips 908 are only shown in FIG. 14. The array 900 is held between end plates 909 and fastened together by inserting pins 910 through the holes 912 and using nuts 914 (FIG. 15) to hold the pins in place, as described above.

For illustration purposes, in FIG. 14A, one of the electrodes and one of the end plates are separated from the array to demonstrate their design characteristics. As shown in FIGS. 14A and 14B, a number of grooves 916 extend from bottom surfaces 918 of the electrodes to top surfaces 920. The grooves are formed on the side walls 922 of the electrodes so that when the side walls 922 of the electrodes placed against the side walls of the insulation members 906 to form the array 900, openings for solution flow are formed.

In this embodiment the contact electrodes 902 and the process electrodes 904 are connected to a power source (not shown) through their contact ends 903 and 905. Except an electrical contact line 924 and the top surfaces 920 of the electrodes 902 and 904, all other surfaces are coated with an insulating film such as a Teflon™ film. The contact ends 903 and 905 may be shaped as a step with a recessed surface 926. Contact ends of the contact electrodes and the contact ends of the process electrodes are positioned along opposite ends of the array 900 as in the manner shown in FIGS. 14A-16. The electrical contact line may be placed on the recessed surface 926. Electrical connection to the power source may be made using a first contact device 928 to connect contact electrodes to the positive terminal and a second contact device 930 to connect the process electrodes to the negative terminal of the power source.

Figure 16:
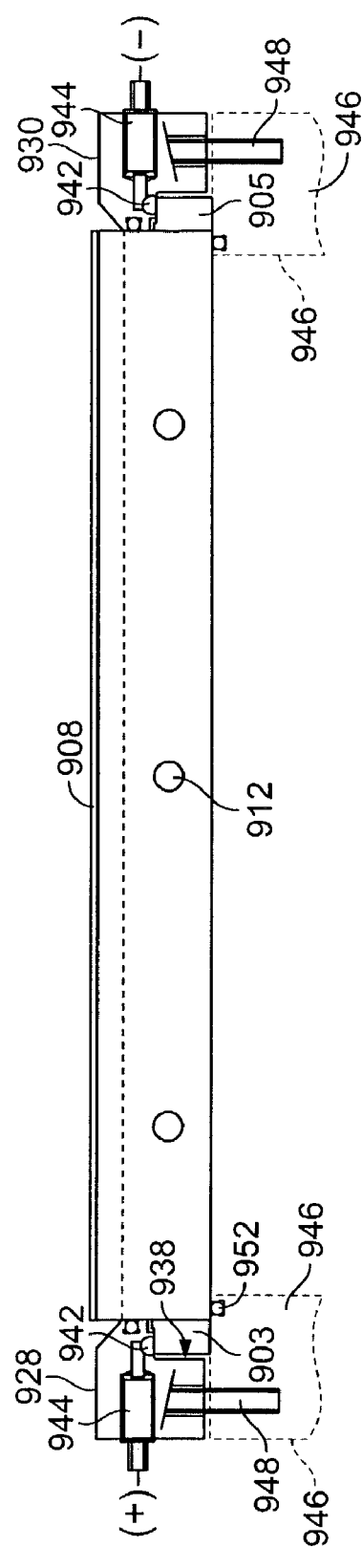
FIG. 16 is a schematic side view of the holder structure with electrical contact devices.
Figure 17:
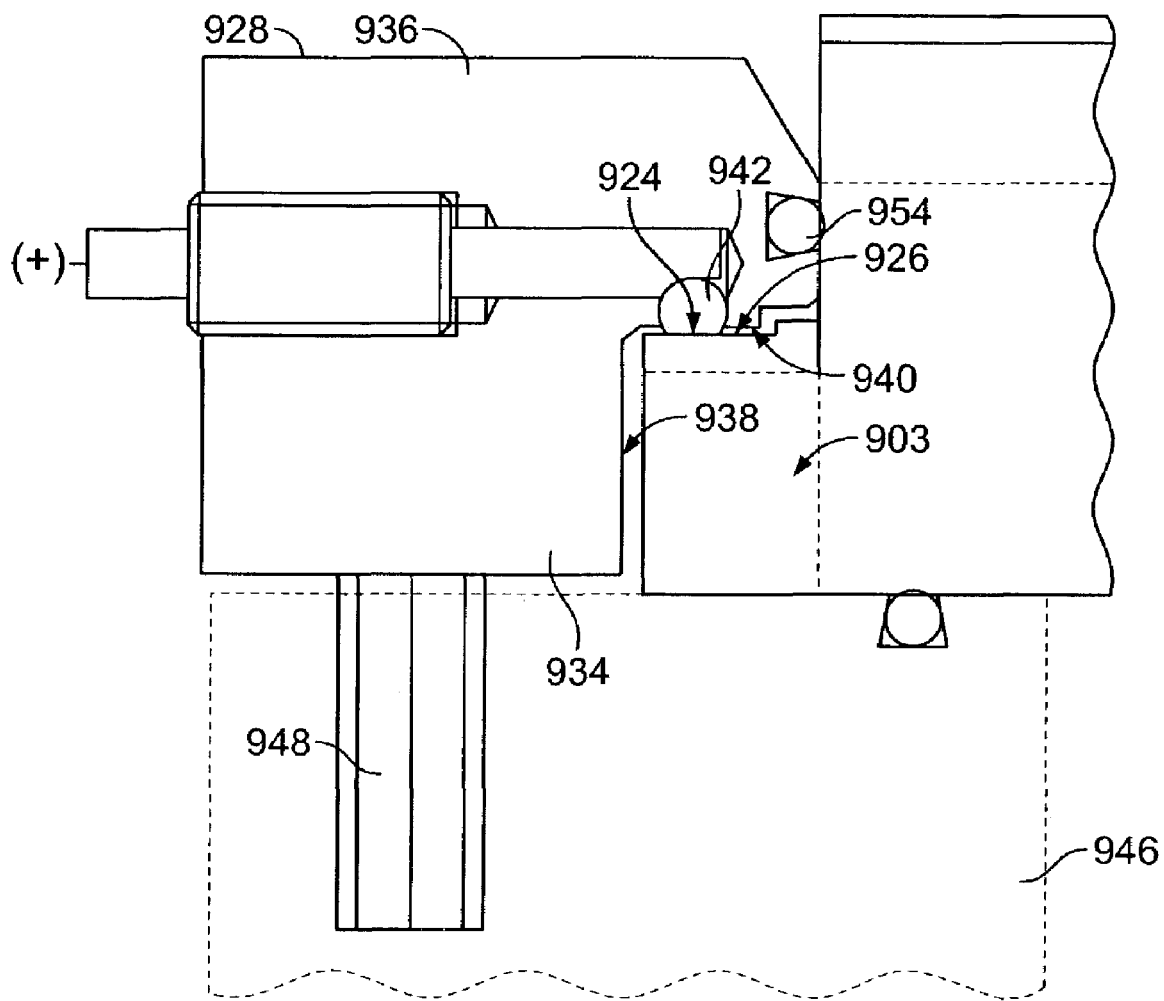
FIG. 17 is a schematic cross sectional view of a contact device of the present invention.

As shown in FIG. 14A-17, the contact devices 928 and 930 comprise an elongated body 932 having a support portion 934 and an extended portion 936. Referring to FIGS. 16 and 17, a front wall 938 of the support portion 936 and a bottom wall 940 of the extended portion 936 of the contact devices define a corner cavity which engages with the step shaped ends of the electrodes 902 and 904 when the contact devices are attached to the ends of the electrodes. In this respect, the first contact device 928 is attached to the contact ends 903 of the contact electrodes while the second contact device 930 is attached to the contact ends 905 of the process electrodes. In FIG. 17 the contact device 928 is illustrated in detail. Although the contact device 928 is used to describe details of the contact devices, the same description is applicable to the contact device 930 because of the identical features of the devices. As shown in FIG. 17, a contact member 942, which is attached to the bottom wall 940 of the extended portion 936, enables electrical connection between the contact line 924 on the recessed surface 926 and the power source. Except the contact member 942, bodies 932 of the contact devices 928 and 930 are coated with Teflon or made of insulating materials such as polymer base materials. Although the example shown in FIGS. 14A-17 describes an array for a single zone holder structure, a system with a multiple zone electropolishing holder structure (see FIG. 13)can also be established using the array 900 and within the scope of this invention.

A conductive line 944 connects the contact member 942 to the power source terminal. Referring to FIG. 16, the contact devices are attached to top ends 946 of side walls of a solution container (not shown) using bolts 948 or other fastening means. The bolts 948 are inserted through the bolt holes 950 shown in for example FIG. 14B. In this respect contact devices 928 and 930 secure the array 900 and hence the holder structure on the process solution container (see FIGS. 12A-12B). Seal members 952 on top ends 946 of the side walls and seal members 954 on the extended portion of the contact devices 928 and 930 prevents any solution leakage into the area where the contact member 942 touches the contact line 924.

Although various preferred embodiments and the best mode have been described in detail above, those skilled in the art will readily appreciate that many modifications of the exemplary embodiment are possible without materially departing from the novel teachings and advantages of this invention.

We claim:

1. An apparatus for electropolishing a conductive layer on a wafer using a solution, the apparatus comprising:
    an electrode assembly configured to be immersed in a solution and configured to be positioned proximate to a conductive layer on a wafer in contact with said solution, the electrode assembly configured to have a longitudinal dimension extending to at least a periphery of a wafer, the electrode assembly including:
        a first elongated contact electrode;
        a first isolator including a side adjacent to the first elongated contact electrode;
        a first elongated process electrode including a side adjacent to an opposite side of the isolator, the first isolator protruding above top surfaces of the first elongated contact electrode and the first elongated process electrode;
        a second elongated contact electrode;
        a second isolator including a side adjacent to the second elongated contact electrode;
        a second elongated process electrode including a side adjacent to an opposite side of the second isolator, the second isolator protruding above top surfaces of the second elongated contact electrode and the second elongated process electrode; and
        a third isolator between a side of the first elongated process electrode and a side of the second elongated process electrode, the third isolator protruding above the elongated contact electrodes and the elongated process electrodes, wherein the first elongated contact electrode, the first isolator, the first elongated process electrode, the second elongated contact electrode, the second isolator, the second elongated process electrode, and the third isolator are fastened together by at least one fastener, wherein the isolators each include a plurality of passages vertically extending through the isolators, the passages being partially defined by the electrodes and configured to allow a solution to flow through the electrode assembly, wherein the isolators each comprise a material having a closed pore structure; and
    a voltage supply configured to apply a potential difference between the contact electrodes and the process electrodes to electropolish the conductive layer on the wafer, wherein the isolators are configured to prevent the contact electrodes and the process electrodes from physically contacting said wafer.

2. The apparatus of claim 1, wherein the electrode assembly includes:
    a third elongated contact electrode;
    a fourth isolator including a side adjacent to the third elongated contact electrode;
    a third elongated process electrode including a side adjacent to an opposite side of the third isolator, the fourth isolator protruding above top surfaces of the third elongated contact electrode and the third elongated process electrode; and
    a fifth isolator between a side of the second elongated process electrode and a side of the third elongated contact electrode, the fourth isolator protruding above the elongated contact electrodes and the elongated process electrodes, wherein the voltage supply is also configured to apply the potential difference between the third contact electrode and the third process electrode.

3. The apparatus of claim 1, further comprising a mechanism configured to produce relative motion between the electrode assembly and a conductive layer on a wafer, wherein motion of said wafer across the elongated process electrodes is configured to electropolish substantially an entire surface of said conductive layer.

4. The apparatus of claim 3, wherein the mechanism is configured to produce reciprocating motion between the electrode assembly and a conductive layer on a wafer.

5. The apparatus of claim 3, wherein the mechanism is configured to produce rotational motion between the electrode assembly and a conductive layer on a wafer.

6. The apparatus of claim 1, wherein the fastener comprises a pin extending through transverse holes in the elongated contact electrodes, the isolators, and the elongated process electrodes.

7. The apparatus of claim 1, wherein the third isolator is adjacent to a side of the first elongated process electrode and a side of the second elongated contact electrode.

8. The apparatus of claim 1, wherein the third isolator is adjacent to a side of the first elongated process electrode and a side of the second elongated process electrode.

9. The apparatus of claim 1, wherein the first isolator protrudes between about 1 and 10 mm above the top surfaces of the first elongated contact electrode and the first elongated process electrode and wherein the second isolator protrudes between about 1 and 10 mm above the top surfaces of the second elongated contact electrode and the second elongated process electrode.

10. The apparatus of claim 1, wherein the first isolator protrudes between about 2 and 5 mm above the top surfaces of the first elongated contact electrode and the first elongated process electrode and wherein the second isolator protrudes between about 1 and 10 mm above the top surfaces of the second elongated contact electrode and the second elongated process electrode.

11. A system for electropolishing a conductive layer on a wafer using a solution, the system comprising:
    a workpiece holder configured to hold a wafer and to expose a conductive layer on said wafer to a solution;
    an electrode assembly configured to be immersed in said solution, the electrode assembly configured to be positioned proximate to the conductive layer and configured to extend past a periphery of the wafer, the electrode assembly including:
        a plurality of elongated contact electrodes configured to receive a potential;
        a plurality of elongated process electrodes alternatingly interposed among the plurality of elongated contact electrodes, each elongated process electrode configured to receive an opposite potential;
        a plurality of insulation members, at least one of the insulation members separating each of the elongated contact electrodes from adjacent ones of the elongated process electrodes; and
        a plurality of compressible strips disposed above the each of the insulation members and between each of the elongated contact electrodes and the elongated process electrodes, top surfaces of the compressible strips being substantially coplanar, wherein the compressible strips each comprise a material having a closed pore structure configured to prevent solution from flowing through the insulation members and the compressible strips, wherein the elongated contact electrodes and the elongated process electrodes each include a plurality of grooves extending through the elongated contact electrodes and the elongated process electrodes, the grooves configured to allow a solution to flow through the electrode assembly; and
    a voltage supply configured to apply a potential difference between at least some of the contact electrodes and at least some of the process electrodes to electropolish the conductive layer on the wafer, the insulation members configured to electrically insulate the plurality of elongated contact electrodes from the plurality of elongated process electrodes during application of said potential difference.

12. The system of claim 11, wherein the elongated contact electrodes and the elongated process electrodes are configured to electropolish the conductive layer on the wafer without physical contact with the wafer.

13. The system of claim 11, further comprising a mechanism configured to produce relative motion between the electrode assembly and the conductive layer on the wafer, wherein motion of said wafer across the elongated process electrodes is configured to electropolish substantially an entire surface of said conductive layer.

14. The system of claim 11, wherein the workpiece holder is configured to produce rotational motion between the electrode assembly and the conductive layer on the wafer.

15. The system of claim 11, wherein the electrode assembly includes:
    a first group comprising a plurality of said elongated contact electrodes, insulation members, compressible strips, and elongated process electrodes, the first group defining a first zone, the elongated contact electrodes and the elongated process electrodes of the first group configured to receive a first potential difference to electropolish a conductive layer on a wafer at a first rate; and
    a second group comprising a plurality of said elongated contact electrodes, insulation members, compressible strips, and elongated process electrodes, the second group defining a second zone, the elongated contact electrodes and the elongated process electrodes of the second group configured to receive a second potential difference to electropolish said conductive layer on said wafer at a second rate different from the first rate.

16. The system of claim 15, wherein the voltage supply comprises a first power source and a second power source, wherein the first power source is configured to apply the first potential difference and wherein the second power source is configured to apply the second potential difference, the first potential difference different from the second potential difference.

17. The system of claim 11, wherein the insulation members and the compressible strips each include a plurality of openings extending through the insulation members and the compressible strips, the openings configured to allow a solution to flow through the electrode assembly.

18. The system of claim 11, wherein each of the compressible strips protrudes between about 1 and 10 mm above the top surfaces of the elongate contact electrodes and the elongate process electrodes.

19. The system of claim 11, wherein each of the compressible strips protrudes between about 2 and 5 mm above the top surfaces of the elongate contact electrodes and the elongate process electrodes.

20. The system of claim 11, wherein the elongate contact electrodes, the insulation members, and the elongate process each have an axis of elongation and a width transverse to the axis of elongation and parallel to a plane defined by the axes of elongation, the widths between about 1 and 10 mm.

21. The system of claim 11, wherein the top surfaces of the compressible strips are configured to contact the conductive surface of the wafer.

22. The system of claim 21, wherein the top surface of each of the compressible strips is abrasive.

* * * * *